(12) United States Patent
Koh et al.

(10) Patent No.: US 10,971,199 B2
(45) Date of Patent: Apr. 6, 2021

(54) MICROCONTROLLER FOR NON-VOLATILE MEMORY WITH COMBINATIONAL LOGIC

(71) Applicant: SANDISK TECHNOLOGIES LLC, Addison, TX (US)

(72) Inventors: Pao-Ling Koh, Fremont, CA (US); Yuheng Zhang, Saratoga, CA (US); Yan Li, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 118 days.

(21) Appl. No.: 16/446,705

(22) Filed: Jun. 20, 2019

(65) Prior Publication Data

US 2020/0402553 A1    Dec. 24, 2020

(51) Int. Cl.
*G11C 7/12* (2006.01)
*H03K 19/173* (2006.01)
(Continued)

(52) U.S. Cl.
CPC ............... *G11C 7/12* (2013.01); *G11C 16/12* (2013.01); *G11C 16/26* (2013.01); *H03K 19/1733* (2013.01)

(58) Field of Classification Search
CPC .... G06F 13/107; G06F 13/4282; G06F 21/56; G06F 21/82; G06F 2213/0008;
(Continued)

(56) References Cited

U.S. PATENT DOCUMENTS 5,509,134 A    4/1996    Fandrich et al.
6,345,348 B2    2/2002    Watanabe et al.
(Continued)

FOREIGN PATENT DOCUMENTS

EP    2211271 A2    7/2010
EP    1636695    3/2011

OTHER PUBLICATIONS

Fox, et al., "Co-processing SPMD Computation on GPUs and CPUs on Shared Memory System," School of Informatics and Computing, Pervasive Technology Institute, Indiana University Bloomington, Apr. 2013.
(Continued)

*Primary Examiner* — Thong Q Le
(74) *Attorney, Agent, or Firm* — Vierra Magen Marcus LLP

(57) ABSTRACT

A non-volatile memory system comprises a memory structure and a control circuit connected to the memory structure. The control circuit is configured to control the non-volatile memory structure to perform memory operations by generating and applying a set of control signals to the non-volatile memory structure The control circuit includes a programmable and reprogrammable microcontroller. For example, the microcontroller includes one or more processors that are programmed using software (e.g., firmware). The use of a programmable processor and software allows for updates and changes to be made easily. Additionally, to reduce the time taken to make some calculations, the microcontroller also includes one or more combinational logic circuits that are in communication with the one or more processors.

20 Claims, 21 Drawing Sheets

(51) Int. Cl.
*G11C 16/26* (2006.01)
*G11C 16/12* (2006.01)

(58) Field of Classification Search
CPC ..... G06F 2213/0024; G06F 2213/0028; G06F 2213/0032; G06F 2213/0036; G06F 2213/0042; G06F 9/45504; G06F 13/10; G06F 13/42; G06F 9/455
See application file for complete search history.

(56) References Cited

U.S. PATENT DOCUMENTS

| | | |
|---|---|---|
| 6,393,561 B1 | 5/2002 | Hagiwara et al. |
| 6,545,891 B1 | 4/2003 | Tringali et al. |
| 6,721,843 B1 | 4/2004 | Estakhri |
| 6,754,765 B1 | 6/2004 | Chang et al. |
| 6,754,828 B1 | 6/2004 | Marisetty et al. |
| 6,765,813 B2 | 7/2004 | Scheuerlein et al. |
| 6,772,276 B2 | 8/2004 | Dover |
| 7,574,611 B2 | 8/2009 | Cohen |
| 7,594,055 B2 | 9/2009 | Gower et al. |
| 7,600,090 B2 | 10/2009 | Cohen et al. |
| 7,620,784 B2 | 11/2009 | Panabaker |
| 7,676,640 B2 | 3/2010 | Chow et al. |
| 7,788,553 B2 | 8/2010 | Chow et al. |
| 7,822,912 B2 | 10/2010 | Pua |
| 8,074,022 B2 | 12/2011 | Okin et al. |
| 8,127,113 B1 | 2/2012 | Sinha |
| 8,131,915 B1 | 3/2012 | Yang |
| 8,327,161 B2 | 12/2012 | Cohen |
| 8,683,149 B2 | 3/2014 | Ware et al. |
| 8,687,423 B2 | 4/2014 | Yoo |
| 8,762,800 B1 | 6/2014 | Weingarten |
| 8,843,731 B2 | 9/2014 | Bueb et al. |
| 9,116,620 B2 | 8/2015 | Lassa et al. |
| 9,583,220 B2 | 2/2017 | Tsai et al. |
| 9,600,191 B2 | 3/2017 | Pawlowski |
| 9,858,242 B2 | 1/2018 | Palmer et al. |
| 2009/0083476 A1 | 3/2009 | Pua et al. |
| 2010/0122097 A1 | 5/2010 | Cohen |
| 2012/0020155 A1 | 1/2012 | Kim |
| 2019/0087359 A1* | 3/2019 | Litichever ............... G06F 21/82 |

OTHER PUBLICATIONS

Altera Corporation, Embedded Design Handbook, Chapter 8: Hardware Acceleration and Coprocessing, ED51006-1.2, Jul. 2011.
Altera Corporation, SOPC Builder User Guide, Dec. 2010.
Intel, "Max 10 User Flash Memory User Guide," UG-M10UFM, Feb. 21, 2017, 29 pages.
Intel, "AN 741: Remote System Upgrade for Max 10 FPGA Devices over UART with the Nios II Processor," AN-741, Feb. 21, 2017, 15 pages.

* cited by examiner

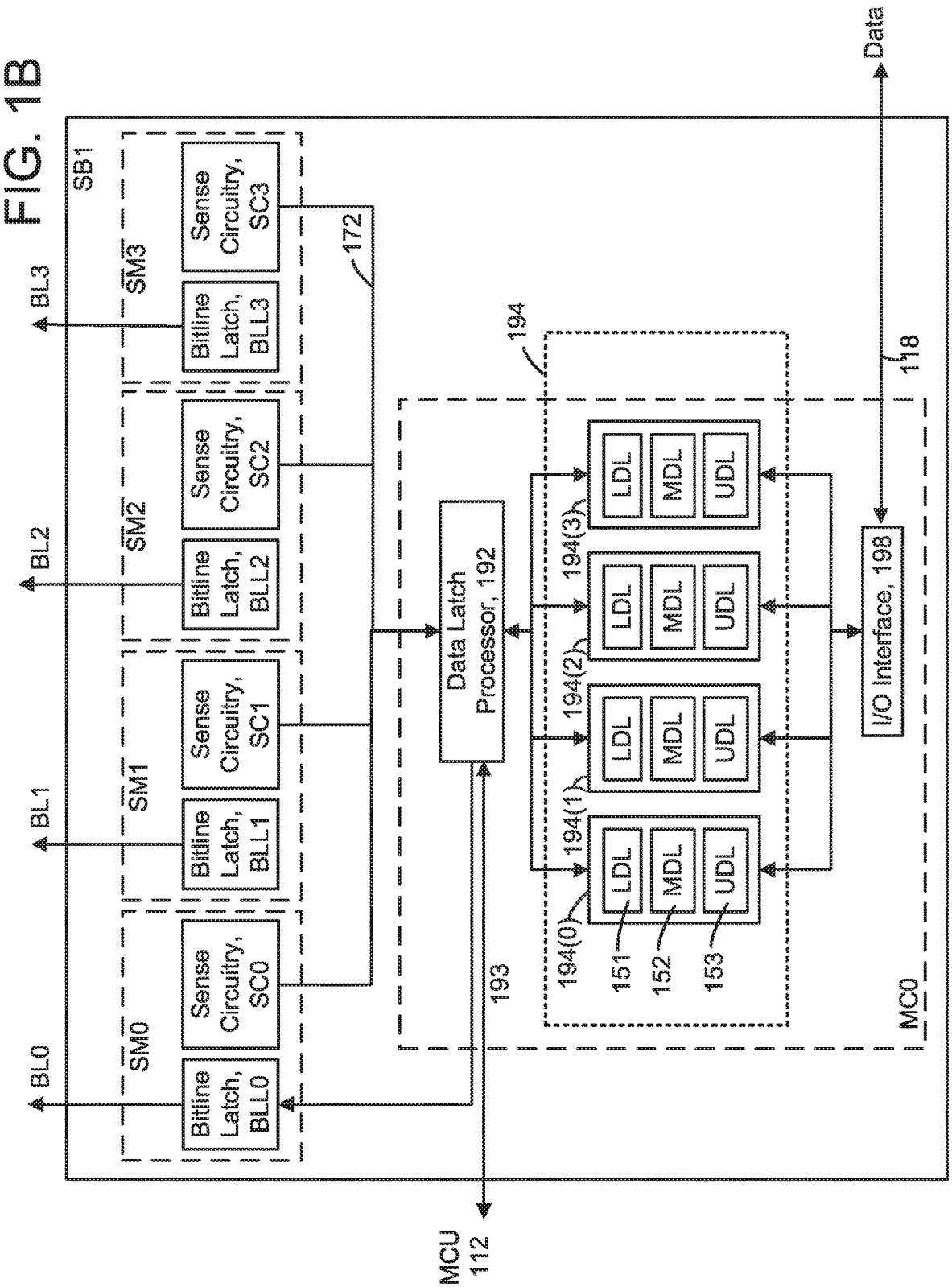

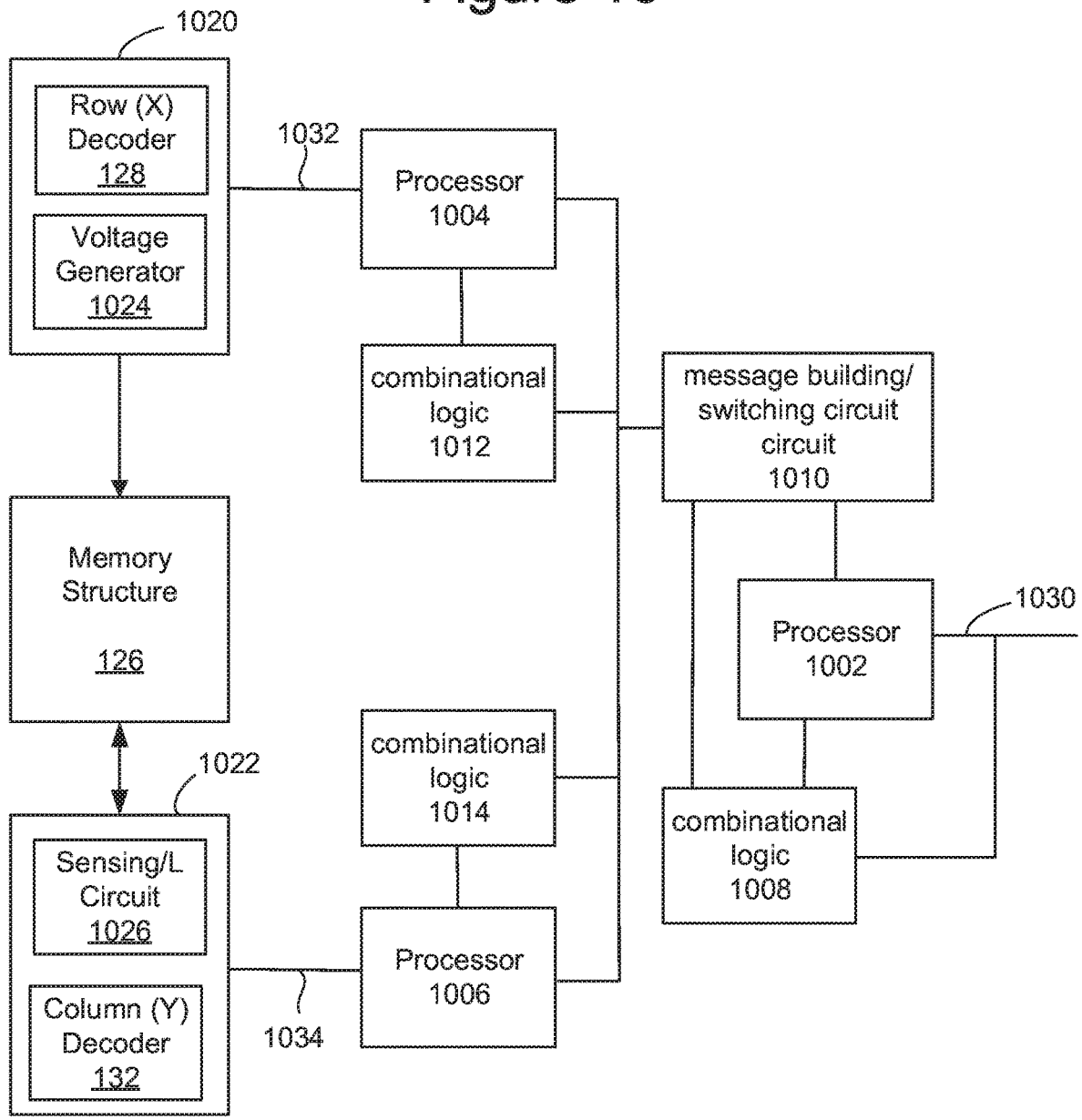

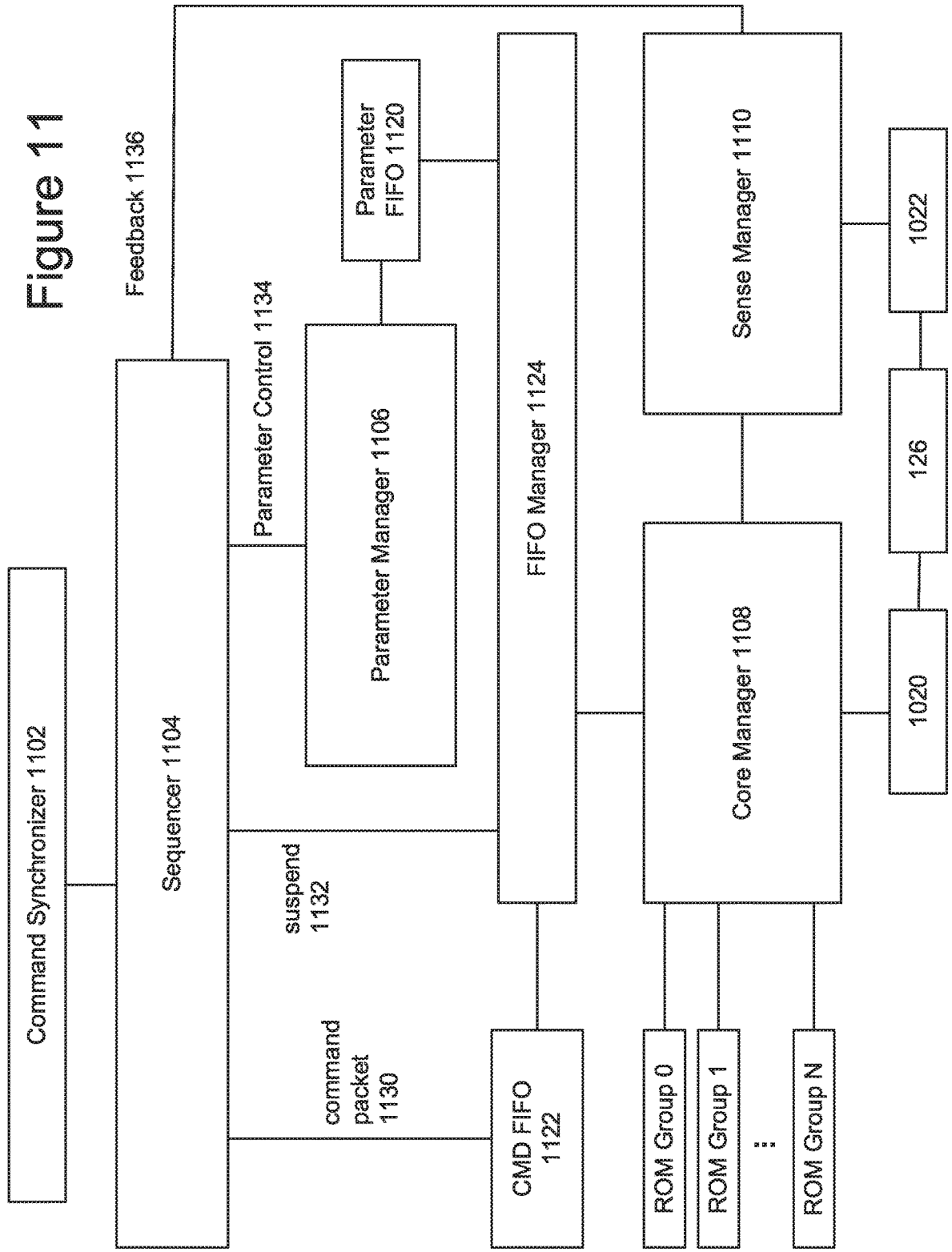

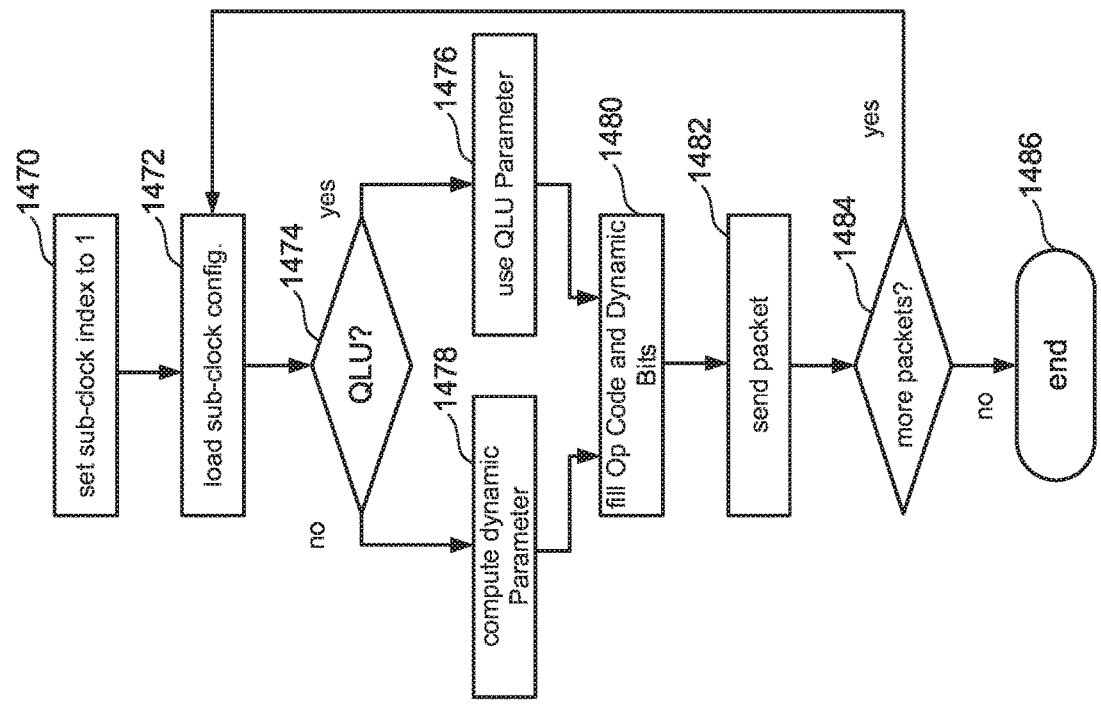
Figure 14C
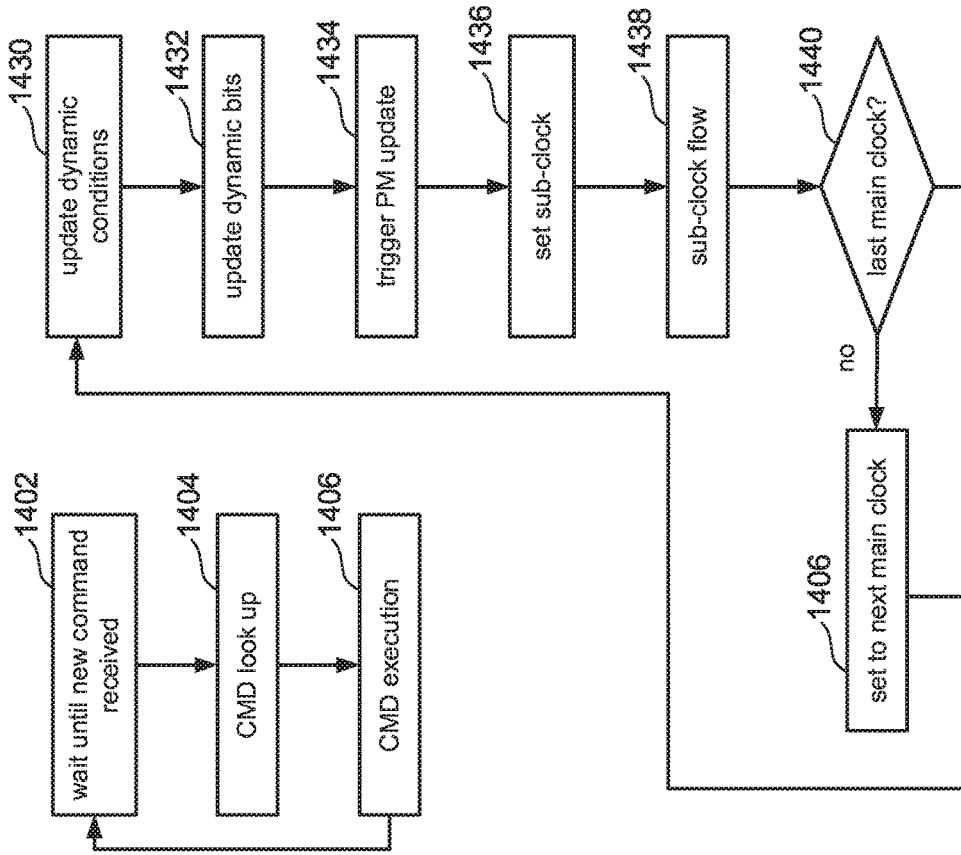
Figure 14B
Figure 14A

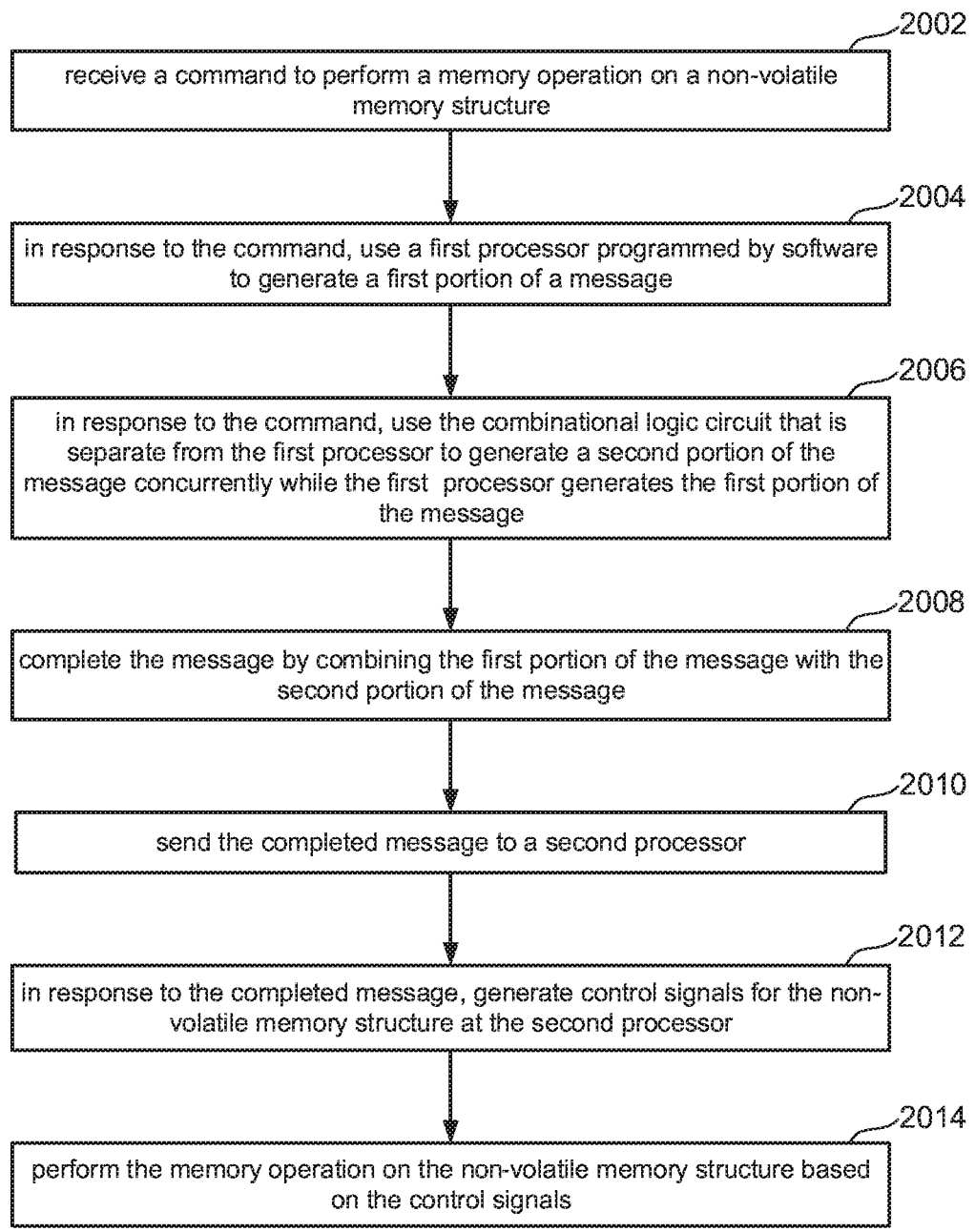

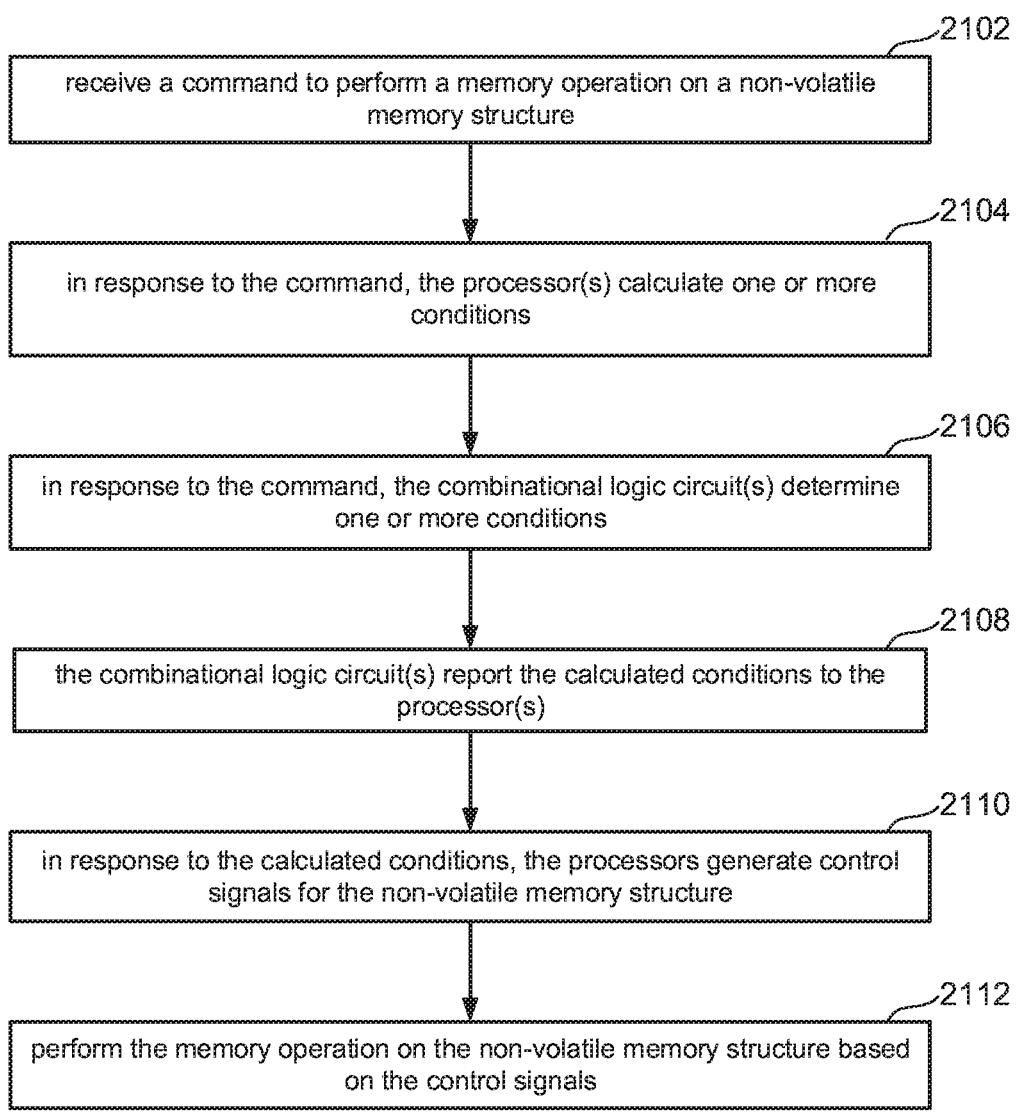

MICROCONTROLLER FOR NON-VOLATILE MEMORY WITH COMBINATIONAL LOGIC

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 1B is a block diagram depicting one embodiment of the sense block SB1 of FIG. 1.

FIG. 10 is a high-level block diagram of one embodiment of a microcontroller that includes a plurality of connected processors that are each connected to a separate combinational logic circuit for generating condition data used by the plurality of connected processors to generate and apply a set of control signals to operate a non-volatile memory structure.

FIG. 11 is a more detailed block diagram of one embodiment of microcontroller that includes one or more combinational logic circuits.

FIG. 12 depicts the contents of a command packet.

FIG. 14A is a flowchart of one embodiment of a command level flow for the Sequencer.

FIG. 14B is a flowchart of one embodiment of a process of executing a command on the sequencer.

FIG. 14C is a flowchart of one embodiment of a sub-clock flow.

FIG. 20 is a flow chart describing one embodiment of a process for operating a microcontroller that includes one or more combinational logic circuits.

FIG. 21 is a flow chart describing one embodiment of a process for operating a microcontroller that includes one or more combinational logic circuits.

DETAILED DESCRIPTION

A proposed non-volatile memory system comprises a memory structure and a control circuit connected to the memory structure. The memory structure includes one or more planes of non-volatile memory cells. The control circuit include a programmable and reprogrammable microcontroller. In one example, the microcontroller comprises multiple programmable processors that execute software to perform different functions in order to control the writing to and reading from the non-volatile memory cells.

For some tasks, however, a programmable microcontroller can be slower than a dedicated hardware circuit. For example, some computations that are not likely to change (and, hence are not likely to be updated) could take a microcontroller many clock cycles to compute. Therefore, it is proposed that the programmable microcontroller include one or more combinational logic circuits to achieve high-speed computation for a subset of tasks.

In one embodiment, the microcontroller includes one or more processors that are programmed using software (e.g., firmware). The use of a programmable processor and software allows for updates and changes to be made easily. Additionally, to reduce the time taken to make some calculations, the microcontroller also includes one or more combinational logic circuits that are in communication with the one or more processors.

Figure 1:
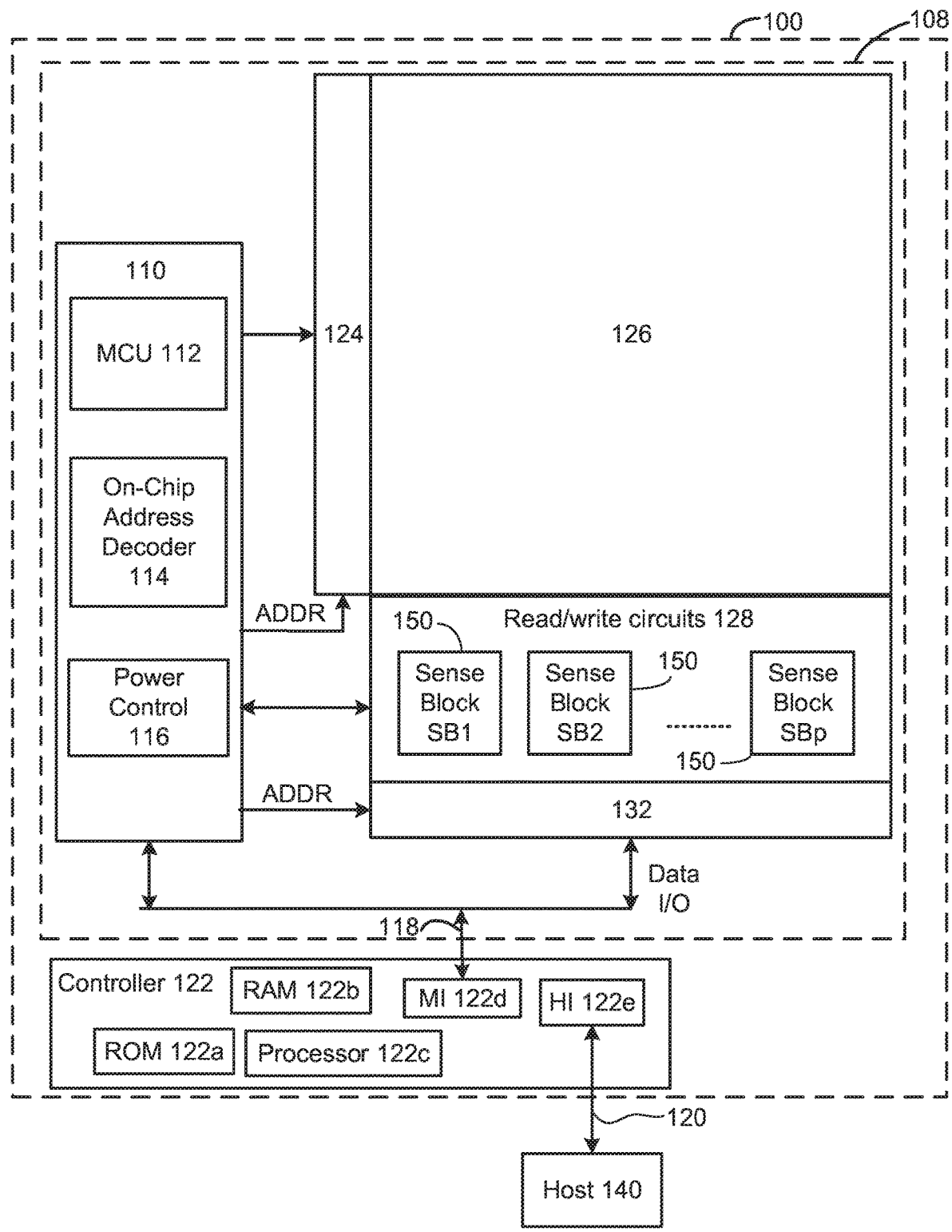
FIG. 1 is a functional block diagram of a memory device.
Figure 2:
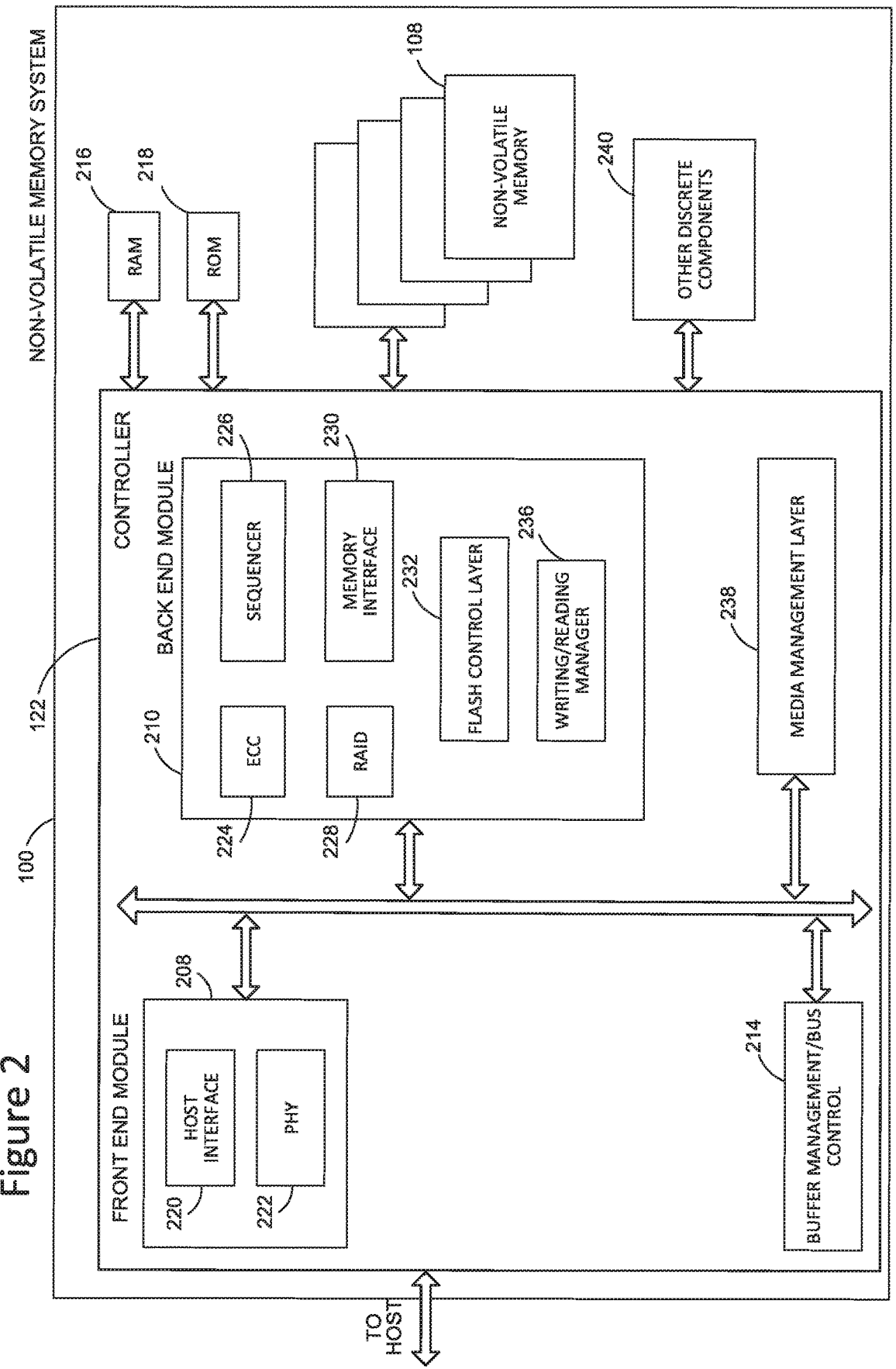
FIG. 2 is a block diagram depicting one embodiment of a memory system.
Figure 3:
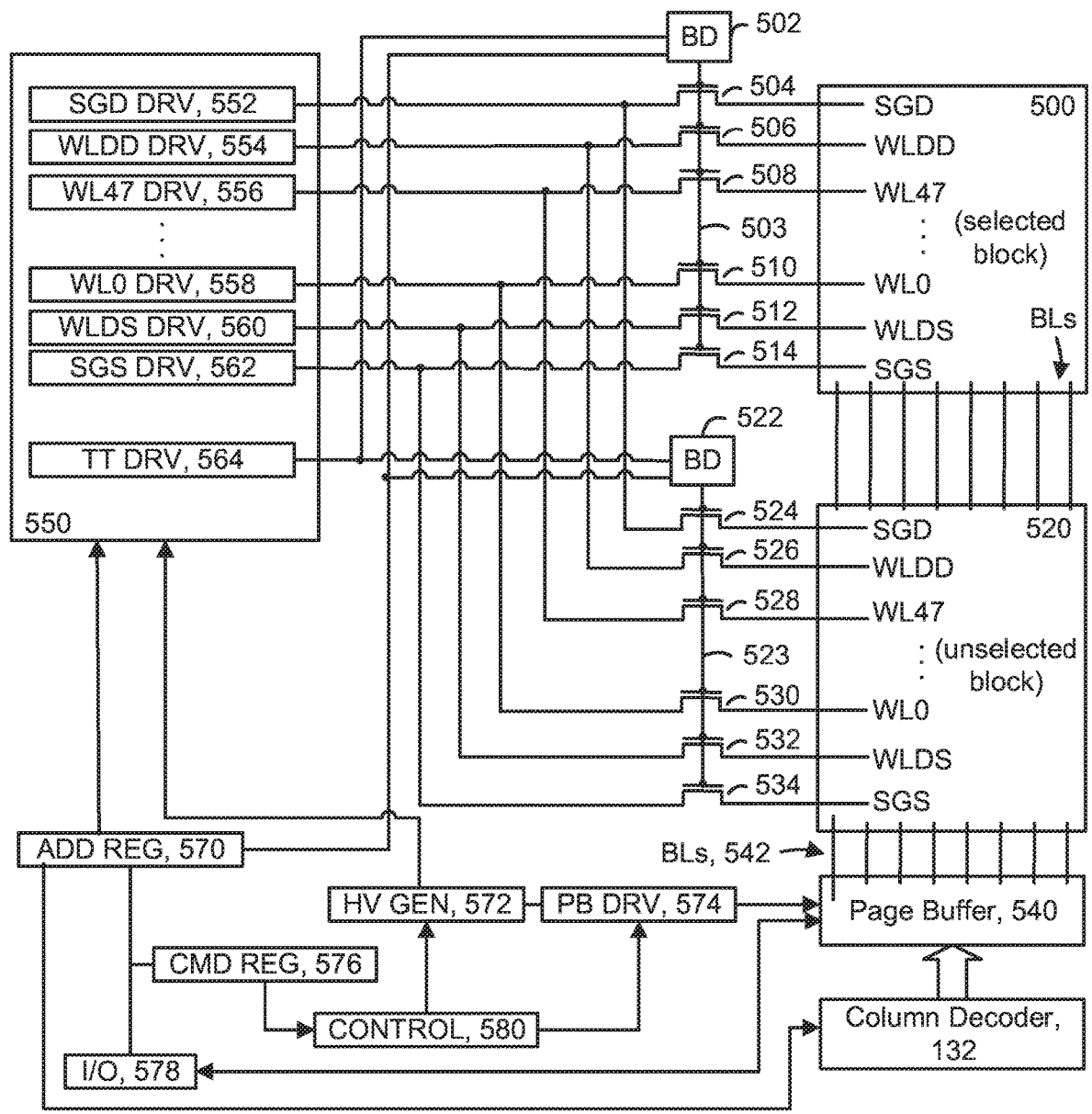
FIG. 3 depicts one embodiment of circuits for applying voltages to a memory structure.

FIGS. 1-3 describe one set of examples of a memory system that can be used to implement the technology proposed herein. FIG. 1 is a functional block diagram of an example memory system 100. The components depicted in FIG. 1 are electrical circuits. Memory system 100 includes one or more memory dies 108. In one embodiment, each memory die 108 includes a memory structure 126, control circuitry 110, and read/write circuits 128. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via an interface 120, and between controller 122 and the one or more memory die 108 via interface 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes programmable and reprogrammable microcontroller (MCU) 112, an on-chip address decoder 114, and a power control circuit 116. The microcontroller 112 provides die-level control of memory operations. In one embodiment, microcontroller 112 is programmable by software. In other embodiments, microcontroller 112 does not use software and is completely implemented in hardware (e.g., electrical circuits). In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines and bit lines during memory operations. Power control circuit 116 may include charge pumps for creating voltages. The sense blocks include bit line drivers.

Microcontroller 112 and/or controller 122 (or equivalently functioned circuits), in combination with all or a subset of the other circuits depicted in FIG. 2 (other than the memory structure), can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

In one embodiment, control circuitry 110 (including microcontroller 112), read/write circuits 128, decoders 124 and decoders 132 are positioned on the substrate and underneath memory structure 126.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1A:
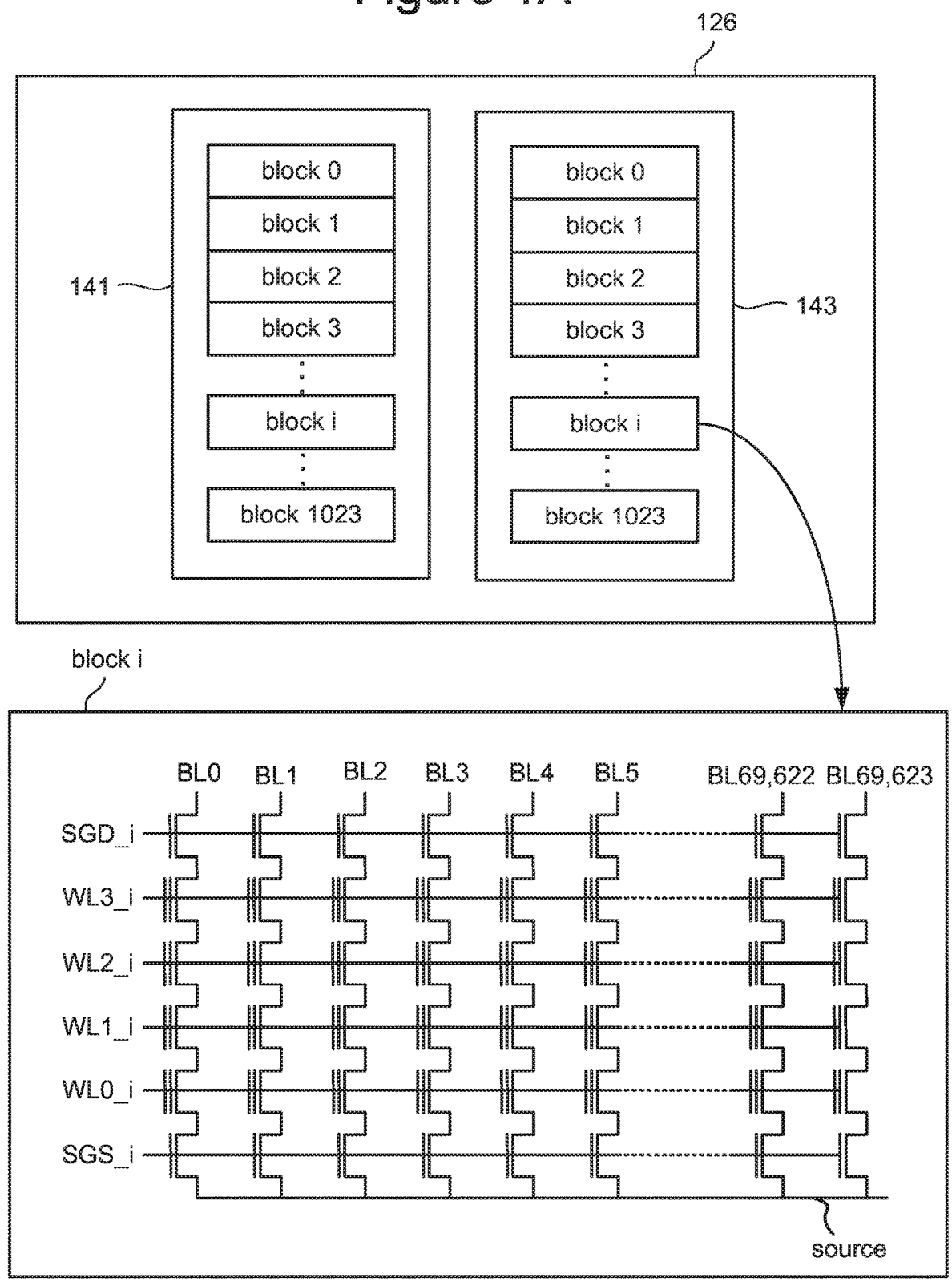
FIG. 1A is a block diagram depicting one example of a memory structure.

FIG. 1A depicts an example of memory structure 126. In one embodiment, an array of memory cells is divided into multiple planes. In the example of FIG. 1A, memory structure 126 is divided into two planes: plane 141 and plane 143. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 1A includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1A shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1A shows 69,624 bit lines, a different number of bit lines can also be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

FIG. 1B is a block diagram depicting one embodiment of the sense block SB1 of FIG. 1A. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming operation, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a data latch processor 192, four example sets of data latches 194(0), 194(1), 194(2) and 194(3) and an I/O interface 198 coupled between the sets of data latches 194 and the lines 118.

In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3. Each set of data latches includes data latches identified by LDL 151, MDL 152, and UDL 153, in this embodiment. LDL 151 stores a bit for a lower page of write data, MDL 152 stores a bit for a middle page of write data, and UDL 153 stores a bit for an upper page of write data, in a memory which stores three bits of data in each memory cell. Note that there may be one set of such latches associated with each bit line. The latches 194 may also be used to store data read from the non-volatile memory cells.

Additional or fewer data latches per set could be used as well. For example, in a two-bit per memory cell implementation, the MDL data latch for the middle page of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its threshold voltage is within a specified margin of the verify voltage of its target data state.

The data latch processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the MCU 112 which controls the supply of different control gate voltages to the addressed memory cell. As it steps through the various predefined control gate voltages corresponding to the various memory states supported by the memory, the sense module may trip at one of these voltages and a corresponding output will be provided from the sense module to the data latch processor 192 via the data bus 172. At that point, data latch processor 192 determines the memory state by consideration of the tripping event(s) of the sense module and the information about the applied control gate voltage from the MCU 112 via input lines 193. It then computes a binary encoding for the memory state and stores the resultant data bits into the data latches 194. For example, the memory state for a memory cell associated with bit line BL0 may be stored in latches 194(0), etc. Herein, a "memory state" may also be referred to as a "data state." In another embodiment of the managing circuit MC0, the bit line latch serves both as a latch for latching the output of the sense module and also as a bit line latch as described above.

In one embodiment, the MCU 112 executes instructions to control the data latch processor 192 to test conditions of non-volatile memory cells in response to voltages applied to the memory structure 126 (such as reference voltages applied to the non-volatile memory cells). The condition of a non-volatile memory cell can be any physical parameter of a non-volatile memory cell. Example conditions include, but are not limited to, a data state (e.g., S0-S7 in FIG. 4), a conduction current, a resistance, and a transistor threshold voltage. The manner in which the condition may be tested may include, but is not limited to, sensing, reading, detecting, measuring, probing, discovering, discriminating, checking, examining, and determining. As used herein a "test" comprises sensing, reading, detecting, measuring, probing, discovering, discriminating, checking, examining, determining, and the like. Therefore, a test condition means any action taken to determine, derive or identify what the state, condition, status, or position of a memory cell is when the action is taken.

In one embodiment, the MCU 112 executes instructions to control the data latch processor 192 to determine a data state (e.g., S0-S7 in FIG. 4) of memory cells. The data state, in certain embodiments, may be defined by a range of some physical parameter including, but not limited to, transistor threshold voltage, resistance, or current. Thus, in one embodiment, to determine a data state means to determine which one of multiple non-overlapping ranges of a certain physical parameter a memory cell is in. In one embodiment, the MCU 112 executes instructions to control the data latch processor 192 to determine whether a memory cell conducts a current in response to voltages applied to the memory cell. In one embodiment, the MCU 112 executes instructions to control the data latch processor 192 to determine whether the threshold voltage of a memory cell is above or below a reference voltage (e.g., Vr1-Vr7; or Vv1-Vv7 in FIG. 4) applied to the memory cell.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the MCU 112 receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the MCU 112 knows to terminate the programming process. Because each processor communicates with four sense modules, the MCU 112 needs to read the wired-OR line four times, or logic is added to data latch processor 192 to accumulate the results of the associated bit lines such that the MCU 112 need only read the wired-OR line one time. Similarly, by choosing the logic levels correctly, the MCU 112 can detect when the first bit changes its state and change the algorithms accordingly.

During program or verify operations, the data to be programmed (write data) is stored in the data latches 194 from the lines 118, in the LDL, MDL, and UDL data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of the MCU 112, comprises a series of programming voltage pulses applied to the control gates of the addressed memory cells. Each programming voltage is followed by a read back (verify test) to determine if the memory cell has been programmed to the desired memory state. In some cases, data latch processor 192 monitors the read back memory state relative to the desired memory state. When the two states agree, the data latch processor 192 sets the bit line latch to cause the bit line to be pulled to a state designating program inhibit (e.g., 2-3 V). This inhibits the memory cell coupled to the bit line from further programming even if programming voltages appear on its control gate. In other embodiments, the data latch processor 192 initially loads the bit line latch and the sense circuitry sets it to an inhibit value during the verify process.

Each set of data latches 194 may be implemented as a stack of data latches for each sense module. In some implementations, the data latches are implemented as a shift register so that the parallel data stored therein is converted to serial data for lines 118, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 2 is a block diagram of example memory system 100, depicting more details of one embodiment of controller 122. The controller in FIG. 2 is a flash memory controller, but not that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. In some embodiments, writing/reading manager 236 performs the processes depicted in the flow charts described below.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block. The MML 238 understands these potential limitations of the memory 126 which may not be visible to the host. Accordingly, the MML 238 attempts to translate the writes from host into writes into the memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

FIG. 3 is a diagram that shows further details of one embodiment of circuits for applying voltages to a memory structure 126. Two blocks 500, 520 of memory cells are depicted. Circuits of FIG. 3 apply voltages to word lines and select lines. The MCU 112 provides control signals to the circuits, in one embodiment. For example, the MCU 112 may issue control signals to one or more of CONTROL 580, HV (High Voltage) GEN (Generator) 572, PB (Page Buffer) DRV (Driver) 574, CMD (Command) REG (Register) 576, I/O (Input/Output) Buffer 578. In one embodiment, the MCU 112 issues control signals to CONTROL 580, which in turn controls other elements such as HV GEN 572 and PB DRV 574.

HV GEN 572 is connected to the word line driver 550, to control magnitudes and timing of voltages, in one embodiment. PB DRV 574 is connected to page buffer 540 to control the page buffer 540. The page buffer 540 may include sense blocks, such as SB1 in FIG. 1B.

Each block of storage elements is associated with a set of transfer transistors, in one possible embodiment. For example, block 500, which is the selected block in this example, e.g., a block in which a programming or sense operation is to take place, includes a drain-side select gate (SGD) connected to a transfer transistor 504, a drain-side dummy word line (WLDD) connected to a transfer transistor 506, a word line (WL47) connected to a transfer transistor 508, intermediate word lines WL30-WL1 (not shown) connected to respective transfer transistors (not shown), a word line (WL0) connected to a transfer transistor 510, a source-side dummy word line (WLDS) connected to a transfer transistor 512, and a source-side select gate (SGS) connected to a transfer transistor 514. The control gate of each transfer transistor of the block 500 is connected to a block decoder (BD) 502 via a common path 503. The BD 502 receives a voltage from a transfer transistor driver (TT DRV) 564 and a control signal from an address register (ADD REG) 570. The control signal includes an address. If the address matches an address of the BD 502, the BD 502 acts as a conductive switch which passes the voltage to the control gates of the associated transfer transistors via path 503. If the address does not match the address of the BD 502, the BD 502 acts as a non-conductive switch which does not pass the voltage to the control gates of the associated transfer transistors.

Each transfer transistor may be an nMOSFET, for example, which has a drain node on the left hand side and a source node on the right hand side. The drain node for each transfer transistor is connected to a respective voltage driver in a set of high-voltage voltage drivers 550. Each driver may include an on-chip charge pump. For example, the transfer transistor 504 is connected to a drain select gate driver (SGD DRV) 552, the transfer transistor 506 is connected to a dummy word line driver (WLDD DRV) 554, the transfer transistor 508 is connected to the word line driver (WL47 DRV) 556, . . . , the transfer transistor 510 is connected to the word line driver (WL0 DRV) 558, the transfer transistor 512 is connected to the source side dummy word line driver (WLDS DRV) 560, and the transfer transistor 514 is connected to the source select gate driver (SGS DRV). Each voltage driver can be independently controlled to provide a desired output voltage.

A similar arrangement is used for the example unselected block 520, which includes a transfer transistor 524 connected to SGD and SGD DRV 552, a transfer transistor 526 connected to WLDD and WLDD DRV 554, a transfer transistor 528 connected to WL47 and WL47 DRV 556, . . . , a transfer transistor 530 connected to WL0 and WL0 DRV 558, a transfer transistor 532 connected to WLDS and WLDS DRV 560, and a transfer transistor 534 connected to SGS and SGS DRV 562. The control gates of the transfer transistors of the unselected block 520 are connected to a respective block decoder (BD) 522 via a common path 523. The BD 522 is also connected to the TT DRV 564 to receive a voltage, and to the address register 570 to receive a control signal which instructs the BD 522 to pass or not pass the voltage to the control gates of the associated transfer transistors via path 523. The address register (ADD REG) 570 also communicates with the voltage drivers in the set of high-voltage voltage drivers 550.

A number of bit lines (BLs) 542 extend across the selected block 500 and the unselected block 520 (and across additional unselected blocks, not shown, in some implementations) and into a page buffer 540, which is responsive to a column decoder 132. The page buffers stores data which is written into, or read from, a selected word line of the selected block. During an operation of the memory device, the address register 570 provides a data load command to an input-output buffer 578 and to a command register 576. The input-output buffer 578 provides the command to the page buffer 540. The command register 576 provides a command to a control circuit 580, which instructs a high voltage generator 572 to control the voltage drivers 550 at appropriate levels. Typically, during programming, the driver of the selected word line provides a programming level voltage, such as 12-26 V while the unselected word lines receive a pass voltage $V_{PASS}$ such as 4-6 V. During sensing, the driver of the selected word line provides a read or verify level voltage ($V_{CGR}$ or $V_{VERIFY}$, respectively), while the unselected word lines receive a read pass voltage, $V_{READ\text{-}PASS}$. The control 580 also instructs the page buffer driver (PB DRV) 574 to control the page buffer 540. The address register 570 also communicates with the column decoder 132.

Figure 4:
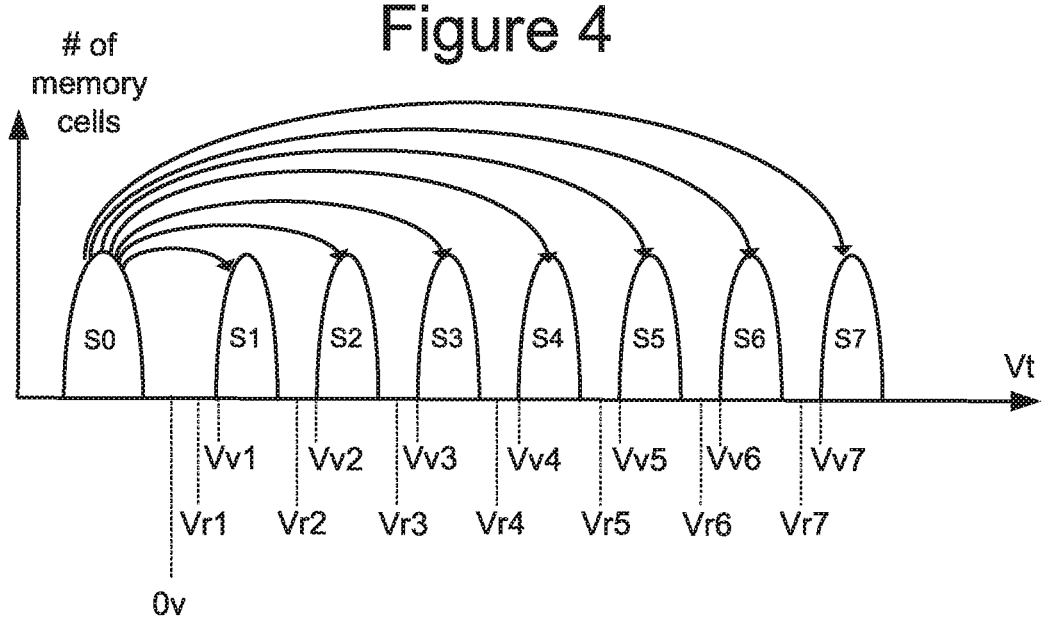
FIG. 4 depicts threshold voltage distributions.

The memory systems discussed above can be erased, programmed/written and read. At the end of a successful programming process (with verification), the threshold voltages of the memory cells should be within one or more distributions of threshold voltages for programmed memory cells or within a distribution of threshold voltages for erased memory cells, as appropriate. FIG. 4 illustrates example threshold voltage distributions for the memory cell array when each memory cell stores three bits of data. Other embodiments, however, may use other data capacities per memory cell (e.g., such as one, two, four, or five bits of data per memory cell). FIG. 4 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 4 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 4 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

The proposed technology described herein can be used for embodiments in which each memory cell stores one bit of data per memory cell (also referred to as SLC) and for embodiments in which each memory cell stores multiple bits of data per memory cell (FIG. 4). When memory cells store one bit of data per memory cell, there may be two data states. When memory cells store two bits of data per memory cell, there may be four data states.

Figure 5:
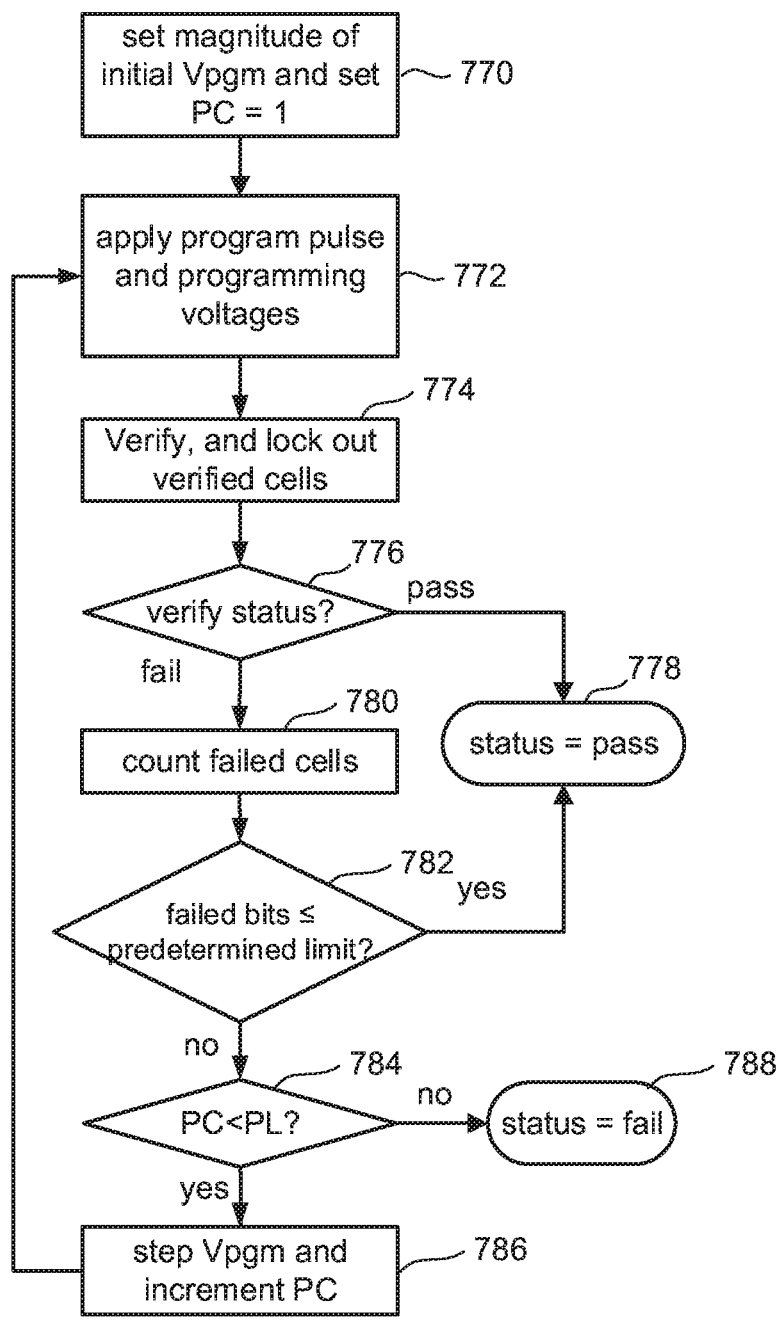
FIG. 5 is a flow chart describing one embodiment of a process for programming/writing data into memory cells connected to a common word line.

FIG. 5 is a flowchart describing one embodiment of a process for programming. The process of FIG. 5 is performed by the memory die in response instructions, data and addresses from controller 122, in one embodiment. In one example embodiment, the process of FIG. 5 is performed on memory die 108 using the one or more control circuits discussed above (see FIG. 1), at the direction of microcontroller 112. The process of FIG. 5 can also be used to implement the full sequence programming discussed above. The process of FIG. 5 can also be used to implement each phase of a multi-phase programming process. Additionally, the process of FIG. 5 can be used to program memory cells connected to the same word line with one bit of data per memory cell.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 5, the programming voltage (Vpgm) is initialized to the starting magnitude (e.g., ~12-16V or another suitable level) and a program counter PC maintained by microcontroller 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target data states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the microcontroller, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 5 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4) or verify operation (e.g. see verify reference voltages Vv1, Vv2, Vv3, Vv4, Vv5, Vv6, and Vv7 of FIG. 4) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Step 772 of FIG. 5 includes applying a program voltage pulse on the selected word line. Step 774 of FIG. 5 includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. The system tests the memory cells to determine whether threshold voltages of the memory cells are greater than the respective verify reference voltages by applying the verify references voltages as verify pulses.

Figure 6:
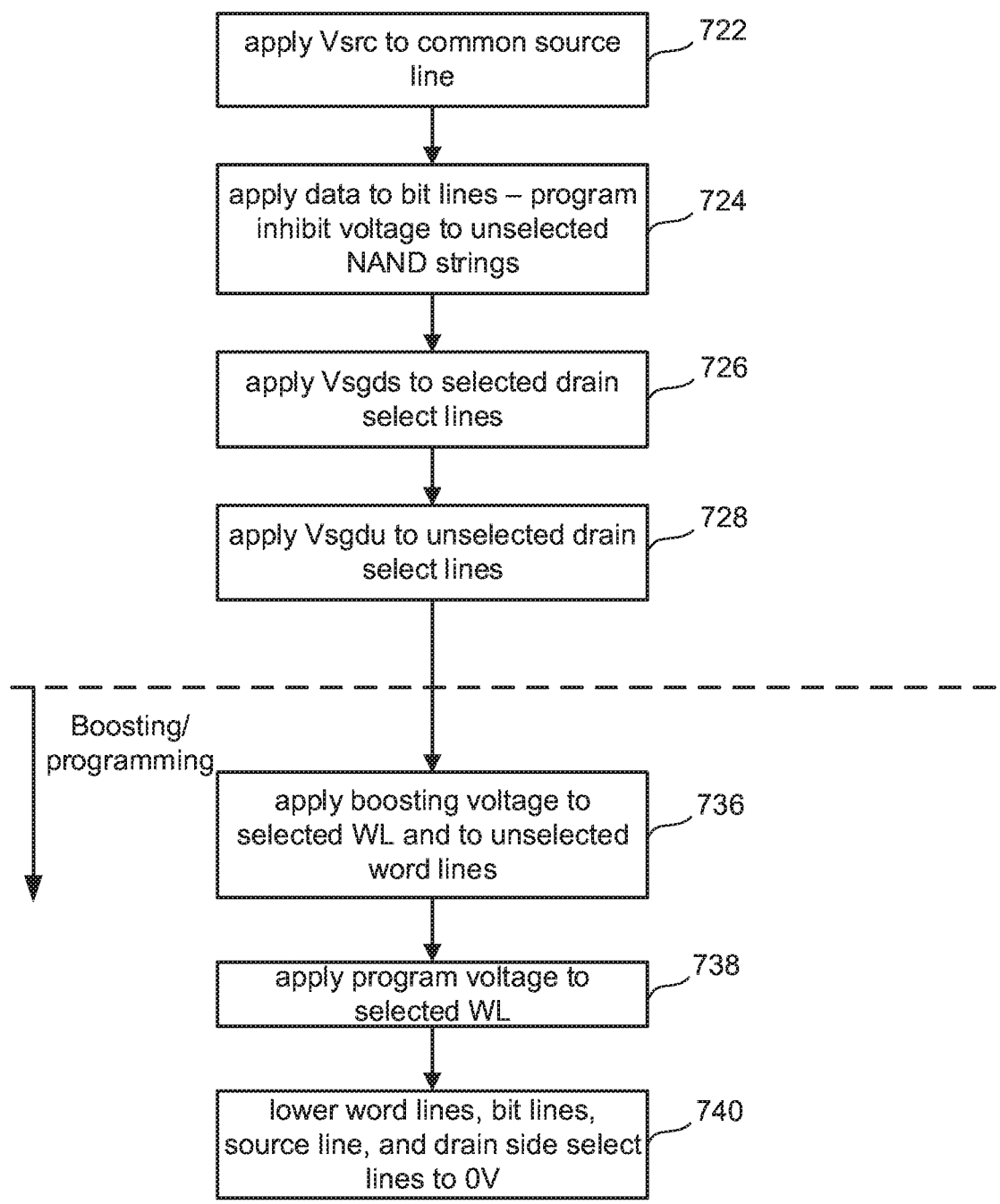
FIG. 6 is a flowchart of one embodiment details of programming non-volatile storage during step 772 of FIG. 5.
Figure 7:
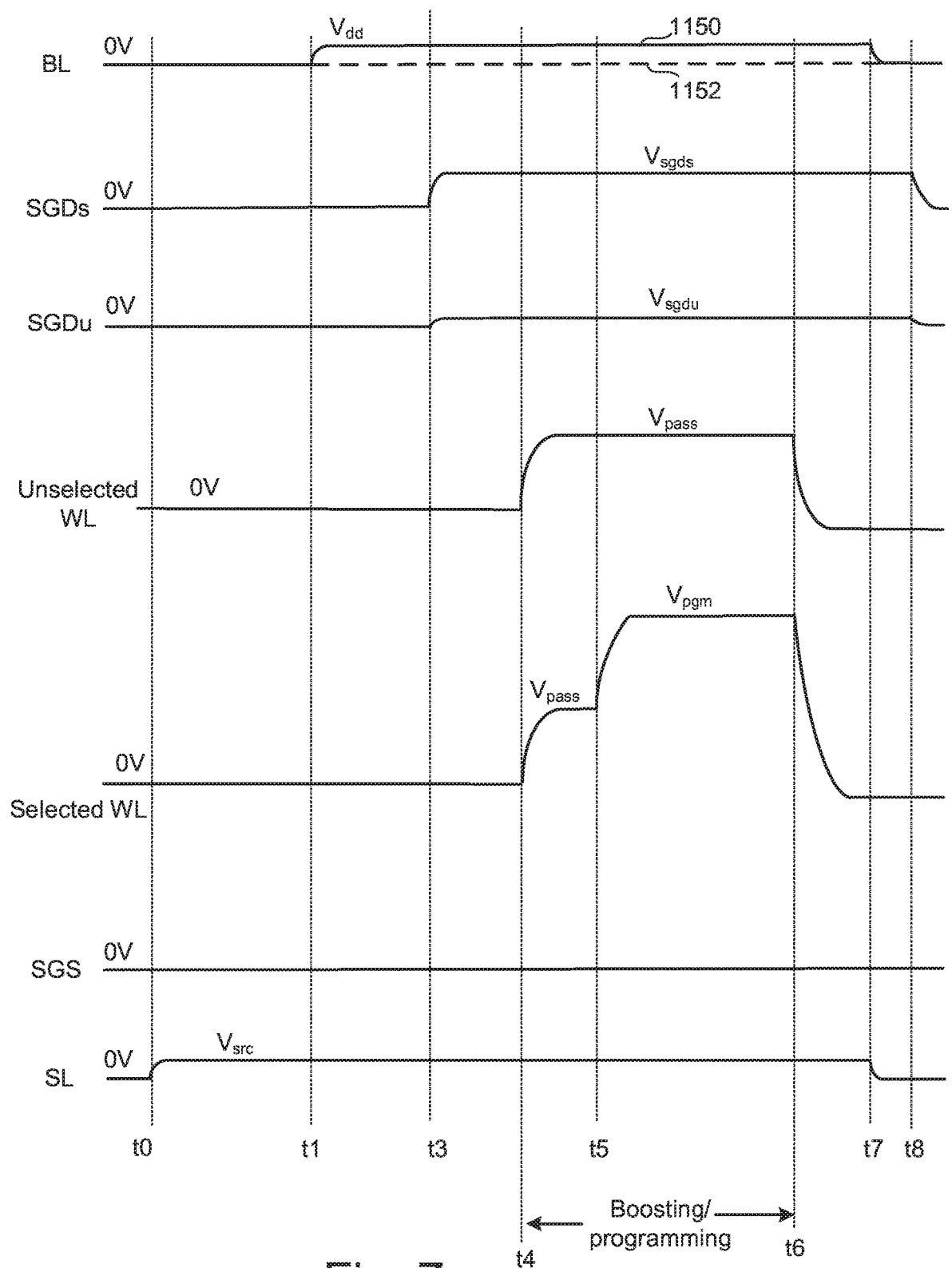
FIG. 7 shows timing of various signals during one embodiment of the process of FIG. 5.

FIG. 6 is a flowchart of one embodiment of applying a program pulse and programming voltages that may be used in step 772 of FIG. 5. This process is used to program 3D NAND in one embodiment. FIG. 7 shows timing of various signals during one embodiment of the process of FIG. 6. The MCU 112 controls the timing and magnitudes of the signals in FIG. 7, in one embodiment. Note that the various signals in FIG. 7 are just one example of voltages applied to the memory structure 126 during a memory operation. The timing of the signals in FIG. 7 is one example of a "core timing chart" or CTC.

A low voltage is applied to the source line at step 722. Referring to FIG. 7, the common source line SL is raised to a low voltage Vsrc (e.g., about 1.0V-1.5V) at time t0 where it remains for the duration of the programming process. The source line SL is kept at 0V in some embodiments. The source select line SGS remains at 0V to place the source select transistors into isolation mode. As one example this could be on the order of 1.0V-1.5V. Note that the other signals in FIG. 7 are at 0V at time t0.

At step 724, the data is applied to the bit lines. The data may be applied to the bit lines based on whether a memory cell in the NAND strings that are in the present programming operation is to be programmed. If the memory cell is to be programmed, then its associated bit line has a program enable voltage (e.g., Vbl_Program_Enable) applied to it. If the memory cell is not to be programmed, then its associated bit line has a program inhibit voltage (e.g., Vbl_Inhibit) applied to it.

Referring to FIG. 7, line 1152 shows the bit line voltage at 0V for a NAND string (in the set that are a part of the present programming operation) having a memory cell at the selected word line WLn that is to be programmed. Line 1150 shows the bit line voltage at $V_{DD}$ for a NAND string (in the set that are a part of the present programming operation) having a cell at WLn that is to be inhibited from programming. $V_{DD}$ designates program inhibit and is often referred to as a program inhibit voltage. Note that line 1152 represents one example of V_Program_Enable, and that line 1150 represents one example of Vbl_Inhibit.

Step 726 is to apply Vsgds to selected drain side select lines. Step 728 is to apply Vsgdu to unselected drain side select lines. Note that FIG. 7 shows two SGD lines. Line SGDs refers to a drain side select line having at least one NAND string that is currently programming. Line SGDu refers to a drain side select line having no NAND strings currently programming.

Referring to FIG. 7, at time $t_3$, drain side select line SGDs is raised to Vsgds, and drain side select line SGDu is raised to Vsgdu. The voltage Vsgds turns on the drain side select transistor for NAND strings having a memory cell being programmed. Note that Vbl_Program_Enable is being applied to the selected bit line BL0 at time $t_3$.

Note that at this time Vsgds may also be applied to control gates of drain side select transistors of NAND strings for which no memory cell should be programmed. However, note that Vbl_Inhibit is being applied to the unselected bit line BL1 at time $t_3$.

Referring again to FIG. 7, at time $t_3$, drain side select line SGDu is set to Vsgdu. The voltage Vsgdu should keep off the associated drain side select transistor.

At step 736, a boosting voltage (e.g., $V_{PASS}$) is applied to unselected word lines. Note that the magnitude for $V_{PASS}$ does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring to FIG. 7, at time $t_4$, the boosting/programming phase begins. The boosting voltages are applied to the various word lines at time $t_4$. In one embodiment, each unselected word line receives a boosting voltage $V_{PASS}$. In one embodiment, the voltage applied to the unselected word lines depends on their position relative to the selected word line.

In one embodiment, a pass voltage is applied to at least a subset of unselected word lines during a program operation. The pass voltage is typically less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

The program voltage $V_{PGM}$ is then applied to the selected word line at step 738. With the boosting voltages applied and the inhibited NAND string channels boosted, program disturb of unselected memory cells on the selected word line is prevented or reduced.

Referring to FIG. 7, at time $t_5$, the program voltage $V_{PGM}$ is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

At step 740, the word lines, bit lines, source lines, and drain select lines are lowered to 0V, marking the completion of one programming iteration. It should be noted that the steps of FIG. 6 can be applied with each iteration of the process of FIG. 5, with the program voltage being increased each iteration. However, it is not required that the program voltage increase in magnitude with each iteration.

Referring to FIG. 7, at time t6, the word lines are lowered to 0V. The source and bit lines are then lowered to 0V at time t7. The drain select line SGD is lowered to 0V at time t8.

Numerous variations to the signals depicted in FIG. 7 can be made in accordance with embodiments. Also note that timing and/or magnitudes of the signals in FIG. 7 (as well as other CTCs) can be modified by modifying instructions executed by the MCU 112. For example, if it is determined that the length of time for which the programming voltage is applied should be changed, then the instructions can be modified to change the length of time between t5 and t6 in the CTC of FIG. 7. Many other modifications to CTCs can be made by modifying instructions executed by the MCU 112 and/or by modifying data that the MCU 112 uses to executed the instructions.

Figure 8:
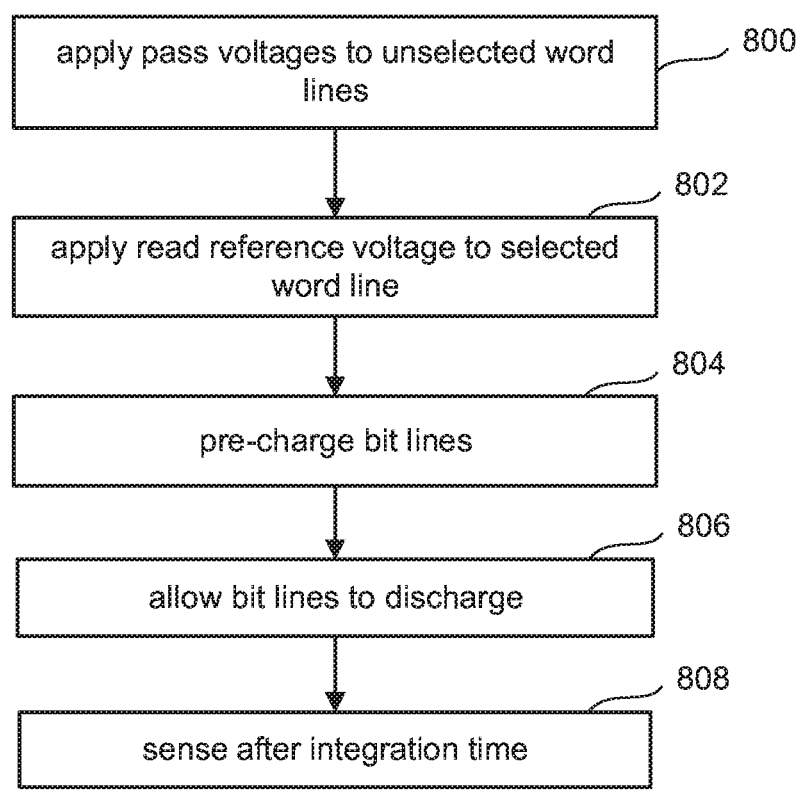
FIG. 8 is a flow chart describing one embodiment of a process for reading data from non-volatile memory cells.

FIG. 8 is a flow chart describing a sensing operation performed in order to read data from the memory cells (or verify programming). In step 800, a pass voltage is applied to unselected word lines so that unselected memory cells on a NAND string are conducting, which enables the system to test whether the selected memory cell conducts in response to the read reference voltage. This pass voltage is often referred to as Vread. In step 802, the appropriate read reference voltage, also referred to as Vcgr, is applied to the selected word line. In one example of a system that stores one bit per memory cell, Vcgr=0 v, or a small voltage near 0 v. In step 804, all of the bit lines are pre-charged. In one example embodiment, the bit lines are pre-charged by charging a capacitor in the sense amplifier and then putting the bit line in communication with the charged capacitor so that the bit line charges up. In step 806, the bit line is allowed to discharge, for example, by discharging the capacitor. After a predetermined time period, referred to as the "integration time" or "strobe time" the voltage of the capacitor is sampled to see whether the respective memory cell(s) conducted in step 808. If the memory cell conducts in response to Vcgr, then the threshold voltage of the memory cell is less than Vcgr. If Vcgr=0 v and the memory cell turns on, then the memory cell is in the erased state and the data stored is 1. If Vcgr=0 v and the memory cell does not turn on, then the memory cell is in the programmed state and the data stored is 0.

Figure 9:
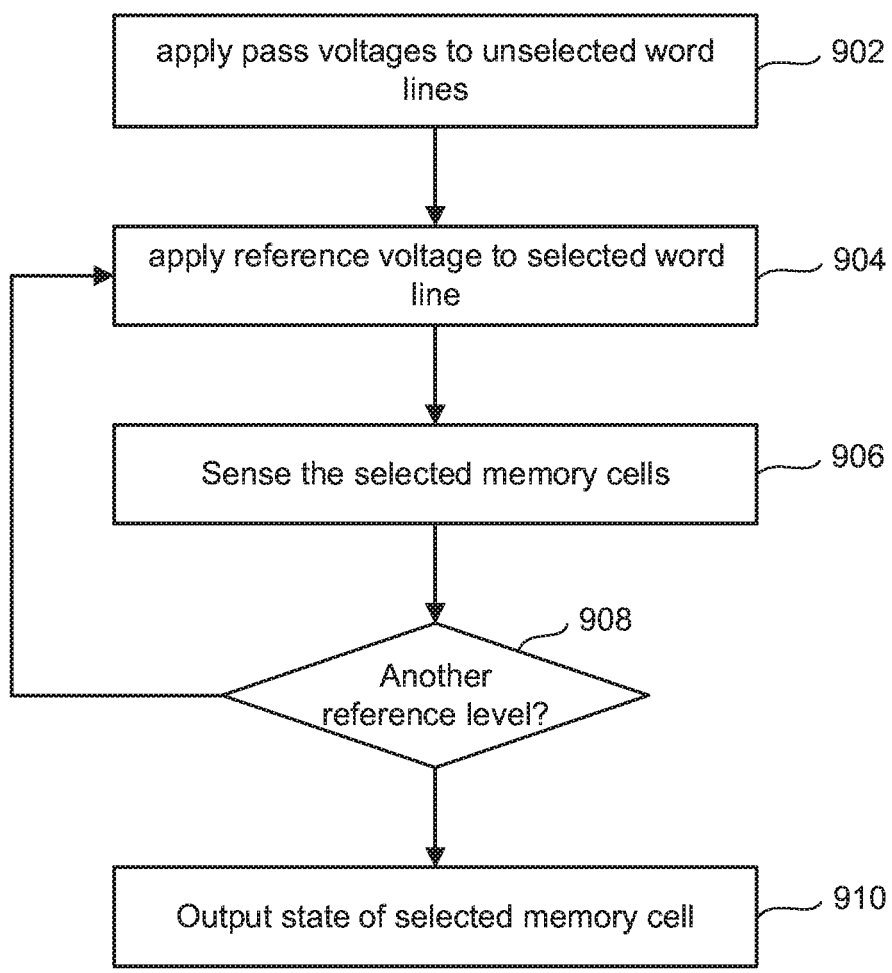
FIG. 9 is a flowchart of an embodiment of process for sensing memory cells.

FIG. 9 is a flowchart of an embodiment of process 900 for sensing memory cells. The process 900 may be used for reading or program verify. The process 900 may be used to determine a data state of a memory cell by performing the sensing at multiple reference levels. For a read operation, the process progressively steps through levels Vr1-Vr7 (see FIG. 4), in one embodiment. For a program verify operation, the process progressively steps through levels Vv1-Vv7 (see FIG. 4), in one embodiment.

Step 902 includes applying pass voltages to unselected word lines. Step 904 includes applying a reference voltage to the selected word line. This might be Vr1 or Vv1, for example. Step 906 includes sensing the selected memory cells. In one embodiment, the sense module (e.g., SM0, SM1, . . . ) connected to the bit line for one of the selected memory cells may trip in response to the reference voltage applied to the selected word line. A corresponding output will be provided from the sense module to the data latch processor 192 via the data bus 172. Based on the reference level when the sense module trips, the data latch processor 192 may determine the data state (e.g., S0-S7) of the selected memory cell. To determine a data state means to determine which one of multiple non-overlapping ranges of a certain physical parameter a memory cell is in. For example, with reference to reading at the reference levels in FIG. 4, the memory cell is in data state S4 if it has a threshold voltage between Vr4 and Vr5. Note that the range of the physical parameter could be unbounded on one side. For example, the range for S7 in FIG. 4 may be unbounded on the upper side. Also, the range for S0 in FIG. 4 may be unbounded on the lower side. Note that steps 904-906 may be referred to herein as a "sensing phase."

Step 908 is a determination of whether there is another reference level to apply to the selected word line. If so, the process 900 returns to step 904 to apply the next reference level. Step 906 is then performed again to test the selected memory cells.

After all reference levels have been applied to the selected word line, step 910 may be performed. In step 910, the data latch processor 192 outputs the data state (e.g., S0-S7) of each of the selected memory cells. Note that it is not required that the data state be output by the data latch processor 192 for a program verify operation.

As described above, in one embodiment a page is the unit of operation for programming (writing) and reading. In one example, a page is all the data stored in all memory cells connected to a common word line. In other embodiments, a page can be one bit of data from each memory cell connected to a common word line. In other embodiments, pages can include other aggregations of data. In one example, a page of data is 16 KB. In some embodiments, the system requires all writing and reading to be by the page. In other embodiments, the system allows partial pages to be written to and read. Example of a partial page can be 2 KB or 4 KB. Other subsets of a page can also be used as a partial page.

Previous state machine designs require tape-out or engineering change orders for each design change or new feature. This slows down the development process. Therefore, it is proposed to use a programmable and reprogrammable microcontroller (e.g., microcontroller 112 of FIG. 1) in place of the previously used state machine. Features can be added and functionality can be changed by updating the software (including firmware) for the microcontroller 112. Microcontroller 112 provides on-die control for reading, programming, and erasing the non-volatile memory cells of memory structure 126. Additionally, microcontroller 112 provides on-die control for interfacing with controller 122.

For some tasks, however, a programmable microcontroller can be slower than a dedicated hardware circuit. Therefore, it is proposed that the programmable microcontroller include one or more combinational logic circuits to achieve high-speed computation for a subset of tasks.

In one embodiment, the microcontroller includes one or more processors that are programmed using software (e.g., firmware). The use of a programmable processor and software allows for updates and changes to be made easily. Additionally, to reduce the time taken to make some calculations, the microcontroller also includes one or more combinational logic circuits that are in communication with the one or more processors.

FIG. 10 is a high-level block diagram of one embodiment of a microcontroller that includes a plurality of connected processors that are each (or a subset) connected to a separate combinational logic circuit for generating condition data used by the plurality of connected processors to generate and apply a set of control signals to operate a non-volatile memory structure. The generated control signals include the signals provided to decoders 124/132 and read/write circuits 128 (including sense blocks) of FIG. 1, the signals to control circuit 580 of FIG. 3, the signals depicted in FIG. 7 or provided to voltage generators to generate the signals depicted in FIG. 7, the signals used to perform all or a subset of the operations of FIGS. 6, 8 and 9, and the signals that control the components depicted in FIG. 1B, including signals that control the bit line latches, the sense circuitry, the data latch processor, the data latches (LDL, MDL, UDL) and I/O interface 198.

FIG. 10 depicts a control circuit connected to non-volatile memory structure 126, where the components of FIG. 10 other then non-volatile memory structure 126 comprise the control circuit. In the embodiment of FIG. 10, the control circuit includes three processors 1001, 1004 and 1006 (all three are electrical circuits that are programmable by software) that are in communication with each other and connected (directly or indirectly) to each other. In one embodiment, processor 1002, processor 1004 and processor 1006 are on same memory die. Processor 1002 is connected to combination logic circuit 1008 and message building/switching circuit 1010. Processor 1002 and combinational logic circuit 1008 receive an input (e.g., command or instruction) from controller 122, non-volatile memory structure 126 or another component. Processor 1002 and combinational logic circuit 1008 provide outputs to message building/switching circuit 1010. In one embodiment, message building/switching circuit 1010 creates messages for output to processor 1004, processor 1006, combinational logic circuit 1012 and combinational logic circuit 1014.

Some of the tasks that can be performed by processors 1002, 1004 and 1006 can be performed by combinational logic circuit 1008, by combinational logic circuit 1012, and by combinational logic circuit 1014, with the results being reported to the connected processor. In one embodiment, processors 1002, 1004 and 1006; combinational logic circuits 1008, 1012 and 1014; and message building/switching circuit 1010 form MCU 112.

Processor 1004 is connected to and receives information from combinational logic circuit 1012. Processor 1004 generates and applies a set of control signals to first circuit 1020, which includes a voltage generator 1024 and row decoder 124. The first circuit 1020 is configured to apply voltages to the memory structure 126. This may include voltages to one or more of word lines, select lines (e.g., SGD, SGS), source lines, as well as other elements in the memory structure 126. First circuit 1020 may include decoders (e.g., row decoder 124) and voltage generators (such as charge pumps), which are connected to and provide the voltages for word lines, select lines (e.g., SGD, SGS), source lines, as well as other elements in the memory structure 126. First circuit 1020 may include power control circuit 116 and/or on-chip address decoder 114. In one embodiment, first circuit 1020 includes one or more of the elements of FIG. 3 that are connected to the blocks 500, 520. For example, the voltage generator 1024 may include high-voltage voltage drivers 550 (each driver may include an on-chip charge pump). The row decoder 124 may include one or more of block decoder (BD) 522, transfer transistors 504-514, 524-534. First circuit 1020 may include other elements from FIG. 3 such as CONTROL 580, HV GEN 572, CMD REG 576, and/or ADD REG 570.

Processor 1006 is connected to and receives information from combinational logic circuit 1014. Processor 1006 generates and applies a set of control signals to second circuit 1022, which is configured to test conditions of the non-volatile memory cells in response to the voltages applied to the memory structure 126. Second circuit 1022 includes sensing circuit 1026 (including latching circuits) and column decoders 132. Se The sensing circuit 1026 may include and control sense amplifiers that sense a current of a memory cell.

In one embodiment, the sensing circuit 1026 includes all or a portion of a sense block (see, for example, SB1 in FIG. 1B). For example, sensing circuit 1026 may include sense modules (e.g., SM0, SM1, SM2, SM3) and data latches (e.g., latches 194). In one embodiment, sensing circuit 1026 includes data latch processor 192 (see FIG. 1B 1B). In one embodiment, data latch processor 192 tests conditions of the non-volatile memory cells in response to the voltages applied to the memory structure 126. Second circuit 1022 may include one or more managing circuits (e.g., MC0, FIG. 1B). It is not required that the sensing circuit 1026 include all of the elements in the MC0 depicted in FIG. 1B. Also, sensing circuit 1026 may include elements not depicted in MC0 of FIG. 1B. In one embodiment, second circuit 1022 includes page buffer 540, PB DRV 574, and I/O 578 (see FIG. 3 3). Note that CONTROL 580 may be shared between first circuit 1020 and second circuit 1022.

The control signals between processor 1004 and first circuit 1020, as well as the control signals between processor 1006 and second circuit 1022 could be analog or digital signals. The control signals may be sent over a communication medium. A communication medium may comprise one or more signal lines. A signal line is capable of transmitting an electrical signal, such as a voltage level, in some embodiments. For example, a signal line may be an electrically conductive path. A signal line is capable of transmitting an electromagnetic signal, such as an optical signal (e.g., light pulse), in some embodiments. For example, a signal line may comprise an optical waveguide. In embodiments, a signal line may include, but is not limited to, one or more of a wire, trace, transmission line, track, pad, layer, lead, metal, portion of a printed circuit board or assembly, conducting material and other material that may transfer or carry an electrical signal, and/or electromagnetic signal. In embodiments, a signal line may form one or more geometric shapes, such as a line or multiple connected lines. In embodiments, a signal line may be unidirectional or bidirectional in transferring signals between circuits and within circuits. Note that the communication medium may comprise elements other than the signal lines, such as drivers, buffers, or logic gates.

In one embodiment, processor 1004 is configured to control first circuit 1020 in order to control analog voltages (e.g., word line voltages, select line voltages, etc.) applied by first circuit 1020 to memory structure 126. Processor 1004 is also configured to control decoders and charge pumps in first circuit 1020, and to control voltage levels applied by sense amplifiers. Note that throughout this description, the phrase, "a processor is configured to control a circuit" or the like, does not require that the processor control all functionality of the circuit.

Note that the timing of the sequences of voltages applied by the first circuit 1020 in order to program, read, or erase memory cells may be very complex. In some embodiments, a core timing chart (CTC) specifies the timing of the sequences of voltages. FIG. 7 shows one example of timing of the sequences of voltages applied during a programming operation. The processor 1004 is configured to implement the core timing chart (CTC) for different memory operations, in one embodiment. Thus, the processor 1004 may be configured to execute first instructions to coordinate sequences of voltages applied to the memory structure 126 by the first circuit 1020 in order to perform memory operations with respect to non-volatile memory cells in the memory structure 126. The memory operations could be, for example, read, program, and/or erase operations.

Processor 1006 generates and sends control signals to second circuit 1022. The control signals could be analog or digital signals. The control signals may be sent over a communication medium. As noted above, a communication medium may comprise one or more signal lines, and may also comprise drivers, buffers, and/or logic gates. Processor 1006 is configured to execute second instructions to control second circuit 1022 to test conditions of the non-volatile memory cells in response to the voltages applied to memory structure 126. The manner in which the conditions may be tested may include, but is not limited to, sensing, reading, detecting, measuring, probing, discovering, discriminating, checking, examining, and determining. For example, the second processor may control second circuit 1022 to determine a data state of the non-volatile memory cells. In one embodiment, the processor 1006 sends control signals to data latch processor 192 (see FIG. 1B).

In one embodiment, processor 1006 controls the sensing circuit 1026 to test conditions of non-volatile memory cells in memory structure 126 in response to voltages applied to the memory structure 126 (such as reference voltages applied to the non-volatile memory cells) by the voltage generator 1024. The condition of a non-volatile memory cell can be any physical parameter of a non-volatile memory cell. In one embodiment, the processor 1006 controls the sensing circuit 1026 to determine a data state (e.g., S0-S7 in FIG. 4) of memory cells. In one embodiment, processor 1006 controls the sensing circuit 1026 to determine whether a memory cell conducts a current in response to voltages applied to the memory cell by the voltage generator 1024. In one embodiment, processor 1006 controls the sensing circuit 1026 to determine whether the threshold voltage of a memory cell is above or below a reference voltage (e.g., Vr1-Vr7; Vv1-Vv7 in FIG. 4) applied to the memory cell.

For example, with reference to FIG. 4, processor 1006 may control the second circuit 1022 to determine which of the data states (e.g., S0-S7) each of a set of memory cells is in. In one embodiment, processor 1006 controls the second circuit 1022 to test whether selected memory cells have a threshold voltage above or below a reference voltage applied by the power control circuit 116. The reference voltage might be one of Vr1-Vr7, with reference to FIG. 4, in the event that a read operation is being performed. The reference voltage might be one of Vv1-Vv7, with reference to FIG. 4, in the event that a program verify operation is being performed.

In one embodiment, processor 1002 provides algorithm flow control, such as steps in programming, reading, and erasing memory cells, in one embodiment. The processor 1002 also calculates magnitudes of analog voltages, such as program voltages and read reference voltages, in one embodiment. In one embodiment, processor 1002 is a master, with processor 1004 and processor 1006 being slaves to the processor 1002. For example, processor 1002 and combinational logic circuit 1008 may provide portions of a command packet/message to message building/switching circuit 1010, which will combine one or more portions of a command packet/message from processor 1002 with one or more portions of a command packet/message from combinational logic circuit 1008 to form an output packet/message for processor 1004, processor 1006, combinational logic circuit 1012 and combinational logic circuit 1014 to instruct those components to perform memory operations on memory structure 126. In some embodiments, message building/switching circuit 1010 receive versions of one or more parameters from processor 1002 and versions of the same one or more parameters from combinational logic circuit 1008, and selectively creates an output parameter(s) based on either the version. This enables the microcontroller to be updated by installing software for the processor to create the updated versions of the one or more parameters (e.g., voltage magnitudes) and instruct the message building/switching circuit 1010 to choose the version from the processor. One of processors 1004 and 1006 is configured to receive the chosen version of the parameter from message building/switching circuit 1010 and use the parameter to determine one or more control signals for memory structure 126.

In one embodiment, the control circuit of FIG. 10 is configured to receive a command to perform a memory operation on a non-volatile memory structure 126. That command is provided to processor 1002 and combinational logic circuit 1008. Combinational logic circuit 1008 is configured to calculate a first condition for the non-volatile memory structure 126 for the command. Processor 1002 is configured to determine a first control signal for performing the command on the non-volatile memory structure 126 based on the first condition calculated by the first combinational logic.

FIG. 11 is a more detailed block diagram of one embodiment of microcontroller 112 that includes one or more combinational logic circuits. In one embodiment, the circuit of FIG. 11 is an example implementation of the circuit of FIG. 10. Command Synchronizer 1102, which receives commands from controller 122, is connected to Sequencer 1104. FIG. 11 shows Sequencer 1104 connected to Parameter Manager 1106, Command (CMD) FIFO 1122, FIFO Manager 1124, and Sense Manager 1110. Parameter FIFO 1120 is connected to Parameter Manager 1124 and FIFO Manager 1124. CMD FIFO is also connected to FIFO Manager 1124. Core Manager 1108 is connected to FIFO Manager 1124, Sense Manager 1110 and a plurality of ROM Groups (ROM Group 0, ROM Group 1, ... ROM Group N). Core Manager 1108 is connected to the first circuit 1020. Sense Manager 1110 is connected to second circuit 1022. Memory structure 126 is connected to first circuit 1020 and second circuit 1022. In one embodiment, all of the components depicted in FIG. 11 are on the same memory die.

In one embodiment, Command Synchronizer 1102 includes a combinational logic circuit (electrical circuit), Sequencer 1104 includes a processor (e.g., a ROM or RAM, and at least one control unit that fetches data and instructions from RAM/ROM and performs some logic operation), Parameter Manager 1106 includes a processor, FIFI Manager 1124 includes a combinational logic circuit, Core Manager 1108 includes a processor, and Sense Manager 1110 includes a processor. In one embodiment, all of the components of FIG. 11 receive the same clock signal.

Command Synchronizer 1102 receives commands from controller 122 and synchronizes the command to the clock signal. It then encodes the commands and sends the commands to Sequencer 1104, where control of the internal flow takes place.

Sequencer 1104, which is the master of Parameter Manager 1106 and FIFO Manager 1124, executes each command. It works out the clock sequence to provide main clock and sub-clock initiators downstream. For each main clock, Sequencer 1104 starts the Parameter Manager 1106 (Parameter Control Signal 1134)) to perform calculations such as biasing voltages and temperature calibration. For each sub-clock, Sequencer 1104 sends a command packet 1130 to CMD FIFO 1122. That command packet 1130 is decoded by the slave modules FIFO Manager 1124, Core Manager 1108 and Sense Manager 1110 to execute the operation. Parameter Manager provides its output to Parameter FIFO 1120, which can then be accessed by FIFO Manager 1124. Sequencer 1104 also provides a signal 1132 to suspend an operation being performed.

Core Manager 1108 is a slave to FIFO Manager 1124. Core Manager 1108 generates control signals for first circuit 1020. Thus, Core Manager 1108 manages the voltage signals to one or more of word lines, bit lines, select lines (e.g., SGD, SGS), source lines, as well as other elements in the memory structure 126. In one embodiment, Core Manager 1108 is processor 1004 of FIG. 10, or performs the same functions and controls the same signals as processor 1004. For each sub-clock, Core Manager 1108 takes a command packet 1130 (or multiple command packets) from CMD FIFO 1122 (via FIFO Manager 1124) performs a look-up and uses the result of the look-up to modify the output signals to first circuit 1020 in order to update the voltage signals to memory structure 126. In one embodiment, the voltage signals to memory structure 126 are divided into groups of signals where the signals of a group are updated together. Based on the conditions at each moment, Core Manager 1108 performs a look-up for each group to modify the signals for that particular group.

Core Manager 1108 is connected to the plurality of ROM Groups (ROM Group 0, ROM Group 1, ... ROM Group N). In one embodiment, each ROM Group stores information to perform one operation (e.g., read, write, erase, etc.). In another embodiment, each ROM Group stores information to perform one option for an operation or part of an operation. In yet another embodiment, each ROM Group stores information to generate one waveform for an operation.

Sense Manager 1110 generates and applies a set of control signals to second circuit 1022, which is configured to test conditions of the non-volatile memory cells in response to the voltages applied to the memory structure 126. In one embodiment, Sense Manager 1110 is processor 1006 of FIG. 10, or performs the same functions and controls the same signals as processor 1006. The command packets 1130 may also include control information for Sense Manager 1110 to perform tasks (see SM Op in FIG. 12). Sense Manager 1110 provides Feedback 1136 to Sequencer 1104.

FIG. 12 depicts the contents of a command packet 1130. The field Timer indicates the number of clock cycles for the current sub-clock. The main clock is a sub-sequence in a sequence of command execution. A sub-clock is a step in the main clock. The Sub_clk filed is a digital label for the current sub-clock. The filed LP (Last Packet) is a "1" to indicate the end of a multiple packet sequence. A majority of sub-clocks need only one packet, but there can be cases when some sub-clocks require more than one packet. The sub-field Dynamic Bit Map is a bit map that shows which conditions/parameters are presently on or off. The field SM Op is control information (e.g. instruction) for Sense Manager 1110.

Figure 13:
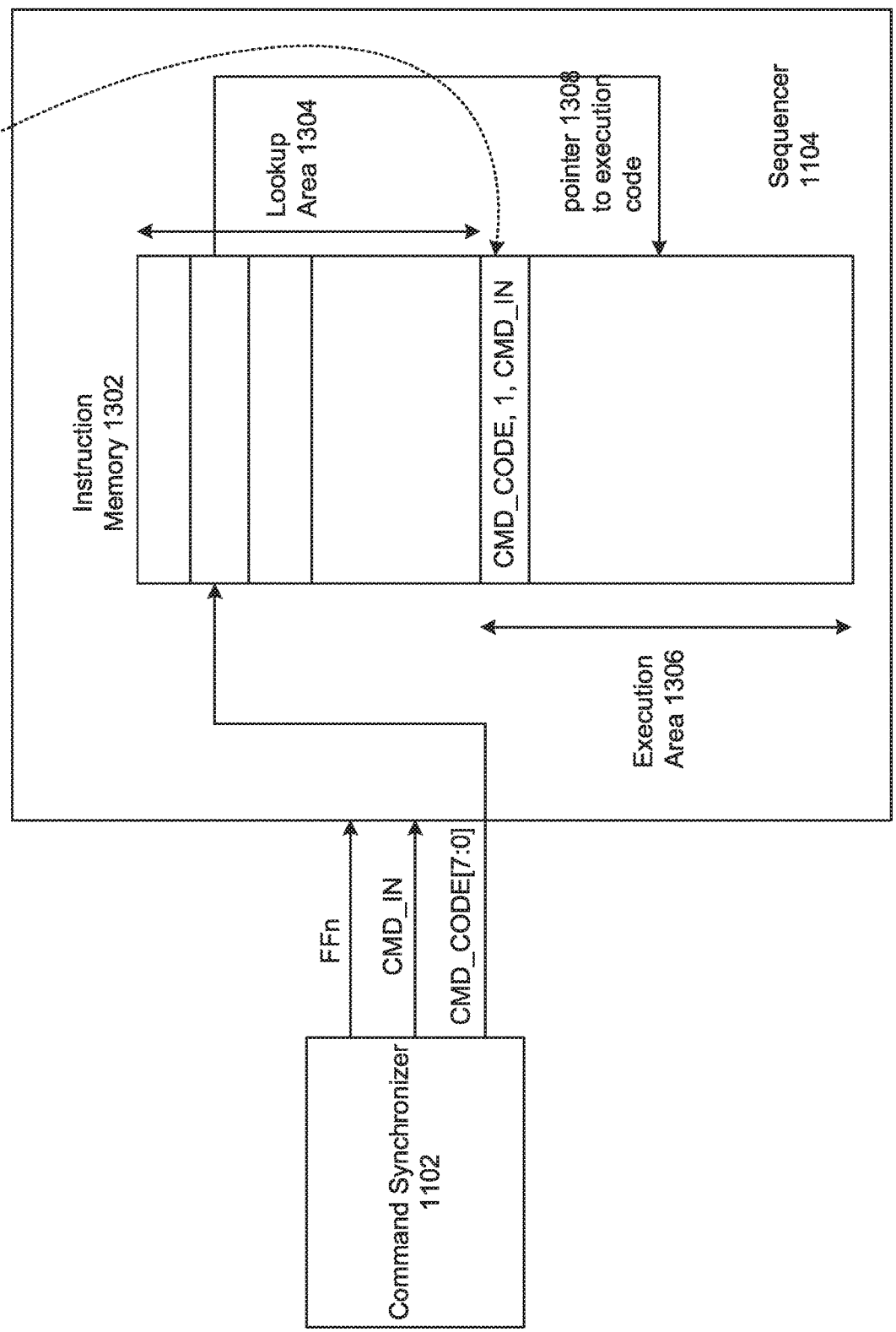
FIG. 13 is a block diagram of one embodiment of the connection between the Command Synchronizer and the Sequencer of the microcontroller of FIG. 11.

FIG. 13 is a block diagram of one embodiment of the connection between Command Synchronizer 1102 and Sequencer 1104 of MCU 112. Command Synchronizer 1102 sends three signals to Sequencer 1104, including an encoded command code CMD_CODE[7:0], a pulsing signal CMD_IN and a reset signal FFn (implemented as an interrupt). A pulse on CMD_IN indicates to Sequencer 1104 that a new command is available on CMD_CODE[7:0]. Sequencer 1104 includes an Instruction Memory 1302 that is divided into two regions: Lookup Area 1304 and Execution Area 1306. CMD_CODE[7:0] serves as an address to Lookup Area 1304, which stores pointers to sections of code in Execution Area 1306 for each command.

FFn input serves as an interrupt in the Sequencer 1104. The control logic for the program counter (PC) of Sequencer 1104 is implemented as:

---
next_PC = FFn & ! interrupt_bypass ? Interrupt_handler_addr: FW_execution_derived_PC;
---

FIG. 14A is a flowchart of one embodiment of a command level flow for the Sequencer 1104. In step 1402, Sequencer 1104 is waiting to receive a new command. When a new command is received (e.g., CMD_IN is pulsed), in step 1404 Sequencer 1104 uses the address received on CMD_CODE [7:0] to lookup the pointer 1308 to execution code in Execution Area 1306 (see FIG. 13). In step 1406, Sequencer 1104 executes the execution code (software/firmware) pointed to in Execution Area 1306.

FIG. 14B is a flowchart of one embodiment of a process of executing a command on Sequencer 1104. That is, the process of FIG. 14B is one example implementation of step 1406 of FIG. 14A. In step 1430, Sequencer 1104 updates dynamic conditions. These are parameters that can change such as temperature, reference voltages, mode of operation, etc. Based on these dynamic conditions and the current command being performed, step 1432 includes updating some of the dynamic bits of the Dynamic Bit Map of command packet 1130. In step 1134, Sequencer 1104 triggers Parameter Manager 1106 to update the parameters used for the current command (via Parameter Control signal 1134). In step 1436, Sequencer 1104 sets the system to be on the first sub-clock of the main clock for the current command. In step 1438, Sequencer 1104 implements the sequence for the current sub-clock. If the current sub-clock is the last main clock (step 1440) for the current command, then the process of FIG. 14B is completed (step 1442). However, if the current main clock is not the last main clock for the current command (step 1440), then the process of FIG. 14B continues at step 1406 with system set to the next main clock for the current command.

FIG. 14C is a flowchart of one embodiment of a sub-clock flow performed by Sequencer 1104. That is, the process of FIG. 14C is one example implementation of step 1438 of FIG. 14B. In step 1470, the index that indicates the current sub-clock (e.g., Sub_clk) is set to 1. In step 1472, configuration information for the current sub-clock is loaded. As described above, some embodiments include combinational logic circuits connected to the processors for calculating parameters/conditions used to determine the control signals for the memory structure. These combinational logic circuits are referred to as Quick Look-up Units (QLU). The sub-clock flow performed by Sequencer 1104 included calculating many parameters/conditions used to determine the control signals for the memory structure. Step 1474 includes determining whether there are one or more combinational logic circuits (aka QLU's) for the parameters/conditions needed to be calculated for the current commands. For a given parameter/condition, if there is a combinational logic circuit that calculates that parameter/condition, then Sequencer 1104 determines (step 1474) whether to use the parameter/condition calculated by the combinational logic circuit (step 1476) or the parameter/condition calculated by the programmable processor (step 1478). In one embodiment, the combinational logic circuit is hard wired and cannot be changed, while the programmable processor can change how it calculates the parameter/condition by updating the software that programs the processor. So the system may be configured to initially have the parameter/condition calculated by the combinational logic circuit (step 1476) and, if the system needs to make an update of how the parameter/condition is calculated, then software is saved into the memory for the processor (e.g., Instruction Memory 1302) to program the processor to calculate the parameter/condition (step 1478). In this way, the system has two means for calculating a parameter/condition. Using the combinational logic circuit (step 1476) results in calculating a parameter/condition during one clock cycle, while using the programmed processor to calculate the parameter/condition (step 1478) is likely to take multiple clock cycles. Thus, if the calculation does not need to be updated, the system normally will choose to use the combinational logic circuit to calculate the parameter/condition (step 1476).

Steps 1474-1478 are performed for each parameter/condition that needs to be calculated in order to determine the bits of the Dynamic Bit Map and SM Op of the command packet 1130. In step 1480, Sequencer 1104 builds the command packet 1130 by inserting the bits of the Dynamic Bit Map and SM Op of the command packet 1130. In step 1482, command packet 1130 is sent from Sequencer 1104 to CMD FIFO 1122, where it is accessed by FIFO Manager 1124 for distribution to Core Manager 1108 and Sense Manager 1110 so that the parameters/conditions in command packet 1130 can be used by Core Manager 1108 and Sense Manager 1110 to generate the control signals to operate non-volatile memory structure 126, as discussed above. If there are more command packets to send for the current sub-clock (step 1484), then the process of FIG. 14C continues at step 1472. If there are no more command packets to send for the current sub-clock (step 1484), then the process of FIG. 14C is completed at step 1486.

Figure 15:
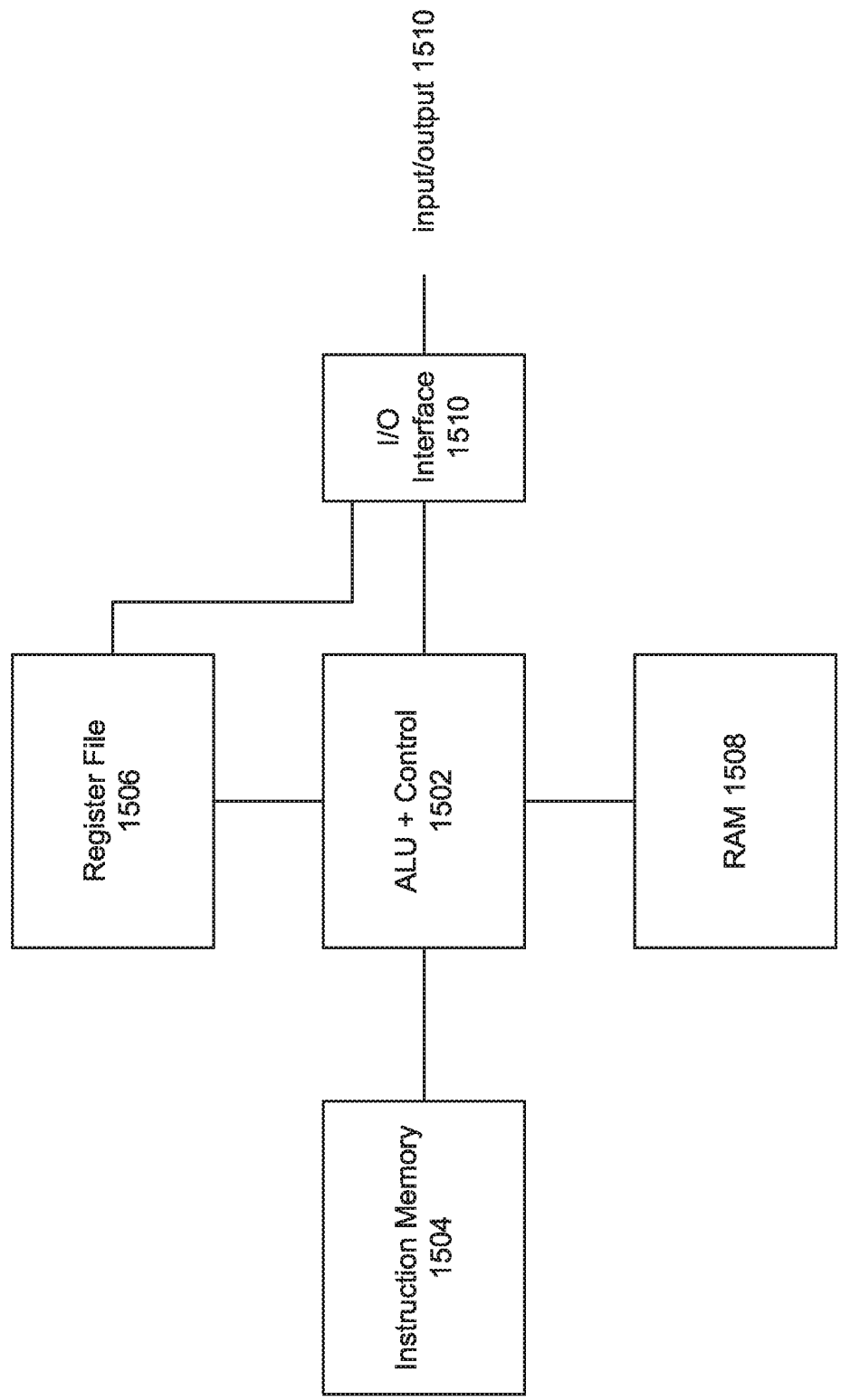
FIG. 15 is a block diagram of one embodiment of a processor architecture for implementing the Sequencer, Core Manager, Parameter Manager and/or Sense Manager.

FIG. 15 is a block diagram of one embodiment of a processor architecture for implementing any of Sequencer 1104, Core Manager 1108, Parameter Manager 1106 and/or Sense Manager 1110. The architecture of FIG. 15 is for implementing a processor without a connected combinational logic circuit for quickly calculating one or more parameters/conditions. The depicted processor of FIG. 15 includes ALU+Control circuit 1502 connected to Instruction Memory 1504, Register File 1506, RAM 1508 and I/O Interface 1510. ALU+Control circuit 1502 includes an arithmetic logic unit for performing mathematical and logic operations on data and a control unit that performs sequencing and control. Instruction Memory 1504 stores the software that programs ALU+Control circuit 1502. Register File 1506 includes a plurality of registers for storing data used by ALU+Control circuit 1502. RAM 1508 is a local volatile memory used by ALU+Control circuit 1502. I/O interface 1510 provides a physical interface for ALU+Control circuit 1502 to communicate with other entities.

Figure 16:
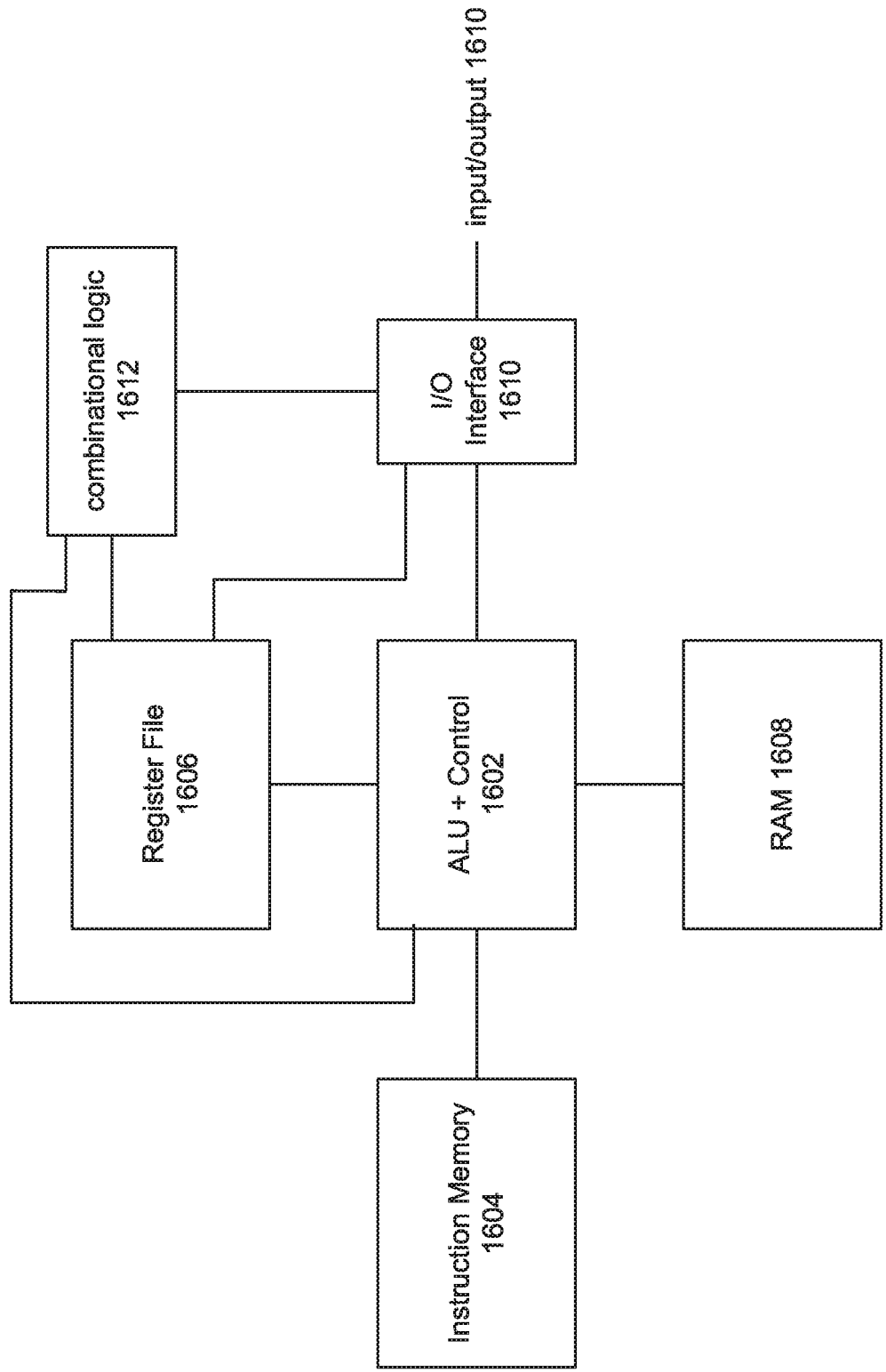
FIG. 16 is a block diagram of one embodiment of a processor architecture for implementing the Sequencer, Core Manager, Parameter Manager and/or Sense Manager.

FIG. 16 is a block diagram of another embodiment of a processor architecture for implementing any of Sequencer 1104, Core Manager 1108, Parameter Manager 1106 and/or Sense Manager 1110. The architecture of FIG. 16 is for implementing a processor with a connected combinational logic circuit for quickly calculating one or more parameters/conditions. The depicted processor of FIG. 16 includes ALU+Control circuit 1602 connected to Instruction Memory 1604, Register File 1606, RAM 1608, I/O Interface 1610 and combinational logic circuit 1612. As discussed above, combinational logic 1612 is dedicated hardware (electrical circuit) that can calculate one or more parameters/conditions. ALU+Control circuit 1602 includes an arithmetic logic unit for performing mathematical and logic operations on data and a control unit that performs sequencing and control. ALU+Control circuit 1602 can also be programmed to calculate the same one or more parameters/conditions as combinational logic 1612 (see steps 1476 and 1478 of FIG. 14C). Instruction Memory 1604 stores the software that programs ALU+Control circuit 1602. Register File 1606, which is also connected to combinational logic circuit 1612, includes a plurality of registers for storing data used by ALU+Control circuit 1602 as well as by combinational logic circuit 1612 to calculate one or more parameters/conditions. Combinational logic circuit 1612 provides its output (e.g., parameters/conditions) to I/O Interface 1610. RAM 1608 is a local volatile memory used by ALU+Control circuit 1602. I/O interface 1610 provides a physical interface for ALU+Control circuit 1602 to communicate with other entities. I/O interface 1610 is also connected to Register File 1606 to receive data from the registers and expose that data to other entities. In one embodiment, I/O interface 1610 includes a circuit for combining the output of combinational logic circuit 1612 with the output of ALU+Control circuit 1602 at the control ALU+Control circuit 1602 so that one or more bits of the output of combinational logic circuit 1612 can be added to or replaced by the output of ALU+Control circuit 1602.

In one embodiment, combinational logic circuit 1612 can also be used to calculate a condition/parameter and send that calculated condition/parameter to ALU+Control circuit 1602. Then ALU+Control circuit 1602 will use the condition/parameter calculated by combinational logic circuit 1612 to generate other conditions/parameters, generate tasks/commands for other processors and/or generate other control signals for the non-volatile memory structure.

Figure 17:
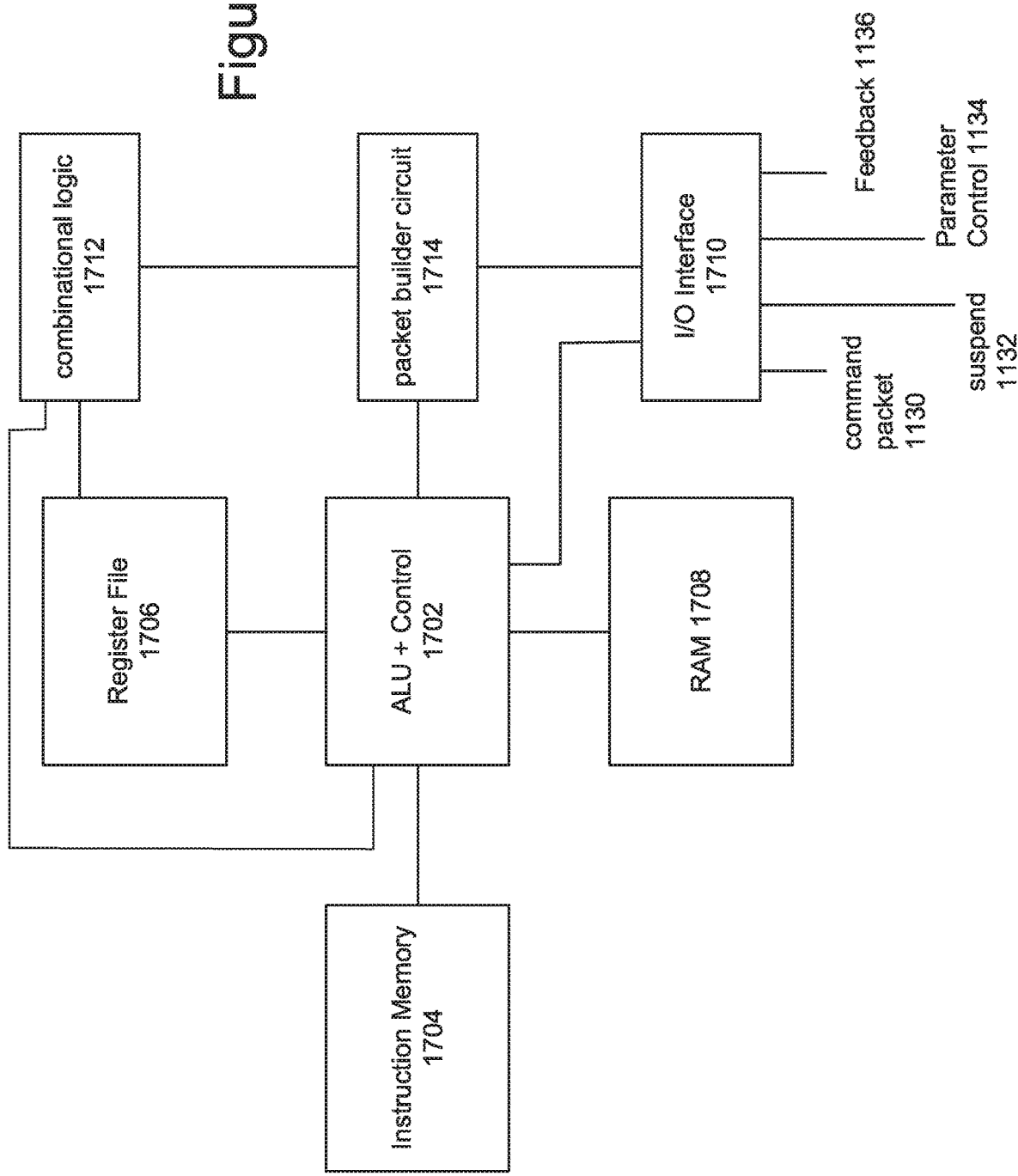
FIG. 17 is a block diagram of one embodiment of a processor architecture for implementing the Sequencer.

FIG. 17 is a block diagram of one embodiment of a processor architecture for implementing Sequencer 1104 of FIG. 11. The structure of FIG. 17 is an example implementation of the structure of FIG. 16, and is for implementing a processor with a connected combinational logic circuit for quickly calculating one or more parameters/conditions. The depicted processor of FIG. 17 includes ALU+Control circuit 1702 connected to Instruction Memory 1704 (analogous to Instruction Memory 1302), Register File 1706, RAM 1708, I/O Interface 1710, combinational logic 1712 and packet builder circuit 1714. As discussed above, combinational logic circuit 1712 is dedicated hardware (electrical circuit) that can calculate one or more parameters/conditions and provide those calculated parameters/conditions to packet builder circuit 1714 and/or ALU+Control circuit 1702. ALU+Control circuit 1702 includes an arithmetic logic unit for performing mathematical and logic operations on data and a control unit that performs sequencing and control. ALU+Control circuit 1702 can also be programmed to calculate the same one or more parameters/conditions as combinational logic 1712 (see steps 1476 and 1478 of FIG. 14C). Instruction Memory 1704 stores the software that programs ALU+Control circuit 1702. Register File 1706, which is also connected to combinational logic circuit 1712, includes a plurality of registers for storing data used by ALU+Control circuit 1702 as well as by combinational logic circuit 1712 to calculate one or more parameters/conditions. RAM 1708 is a local volatile memory used by ALU+Control circuit 1702. I/O interface 1710 provides a physical interface for ALU+Control circuit 1702 to communicate with other entities. FIG. 17 shows I/O interface 1710 having Feedback 1136 as an input, and command packet 1130, suspend signal 1132 and Parameter Control Signals 1134 as outputs.

Combinational logic circuit 1712 provides its output (e.g., parameters/conditions) to packet builder circuit 1714. For example, combinational logic circuit 1712 calculates one or more parameters/conditions and sends those parameters/conditions to packet builder circuit 1714. ALU+Control circuit 1702 also calculates one or more parameters/conditions and sends those parameters/conditions to packet builder circuit 1714. At the control of ALU+Control circuit 1702, packet builder circuit 1714 builds the command packet using the parameters/conditions from ALU+Control circuit 1702 and the parameters/conditions from combinational logic circuit 1712.

For example, ALU+Control circuit 1702 may calculate a first set of bits for the Dynamic Bit Map of command packet 1130 and combinational logic circuit 1712 may calculate a second set of bits for the Dynamic Bit Map of command packet 1130. Packet builder circuit 1714 will insert the first set of bits into command packet 1130 and the second set of bits into command packet 1130, and then provides command packet 1130 to I/O Interface 1710 for transmission to CMD FIFO 1122 (see FIG. 11).

As described above, ALU+Control circuit 1702 can be programmed to override combinational logic circuit 1712. In such a case, combinational logic circuit 1712 is configured to receive an input from Command Sequencer 1102 (or register file 1706) and calculate a first version of a parameter (e.g., a first word line voltage) based on that input, and ALU+Control circuit 1702 may be programmed to receive the same input and calculate a second version of the parameter (e.g., an updated magnitude for the word line voltage) based on the same input, where the first version of the parameter is different than the second version of the parameter. Packet builder circuit 1714 acts as a switching circuit to receive the first version of the parameter from the combinational logic circuit 1712 and the second version of the parameter from the ALU+Control circuit 1702 and selectively create an output parameter based on either the first version of the parameter or the second version of the parameter. That output parameter is added to the command packet and provided to other processors, such as Core Manager 1108 and/or Sense Manager 1110, via CMD FIFO 1122 and FIFO Manager 1124. Note that other processors that receive the command packet may have their own connected combinational logic circuit that calculate other conditions that are used by the other processors to calculate other control signals for the non-volatile memory structure.

The replacing of the condition/parameter calculated by combinational logic circuit 1712 with a condition/parameter calculated by ALU+Control circuit 1702 can be done at the granularity of a single bit in the command packet or at the granularity of multiple bits.

In addition to switching between conditions/parameters from combinational logic circuit 1712 and ALU+Control circuit 1702, combinational logic circuit 1712 can also be used to calculate a condition/parameter and send that calculated condition/parameter to ALU+Control circuit 1702. Then ALU+Control circuit 1702 will use the condition/parameter calculated by combinational logic circuit 1712 to generate other conditions/parameters, generate tasks/commands for other processors and/or generate other control signals for the non-volatile memory structure.

Figure 18:
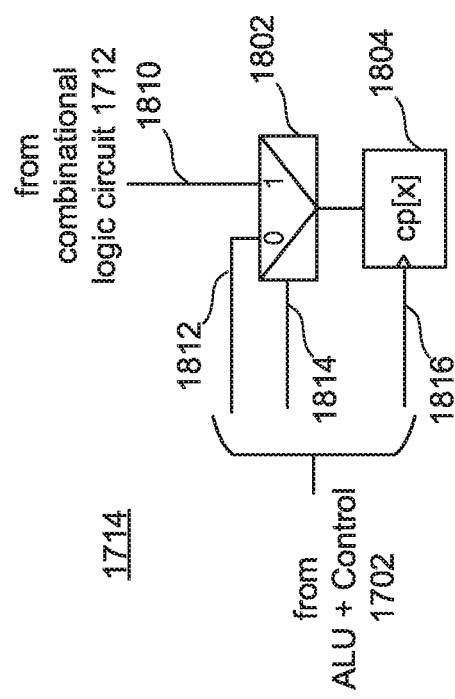
FIG. 18 is a block diagram of one embodiment of a portion of the packet builder circuit.

FIG. 18 is a block diagram of one embodiment of a portion of packet builder circuit 1714. In one set of embodiments, packet builder circuit 1714 builds a packet that has many bits (e.g., see FIG. 12). The structure depicted in FIG. 18 is for one bit. Therefore, packet builder circuit 1714 will have multiple copies of the structure depicted in FIG. 18. In general, the structure depicted in FIG. 18 includes a multiplexer 1802 that provides its output to a flip flop 1804, the output of which is one bit cp[x] of command packet 1130. Multiplexer 1802 receives one input 1810 from combinational logic circuit 1712 and another input 1812 from ALU+Control circuit 1702. Multiplexer 1802 also receives a selection signal 1814 from ALU+Control circuit 1702 that enables ALU+Control circuit 1702 to choose whether cp[x] is generated from ALU+Control circuit 1702 or combinational logic circuit 1712. ALU+Control circuit 1702 also provides clock signal to flip flop 1804 to control when the data is captured. Thus, FIG. 18 is an example where the output of the combinational logic circuit and the output of the processor has a common bit(s) (or overlapping bits) and a switching circuit (e.g., multiplexer) is used so that the processor can override the common bit(s) of the combinational logic circuit with its own bit(s).

Figure 19:
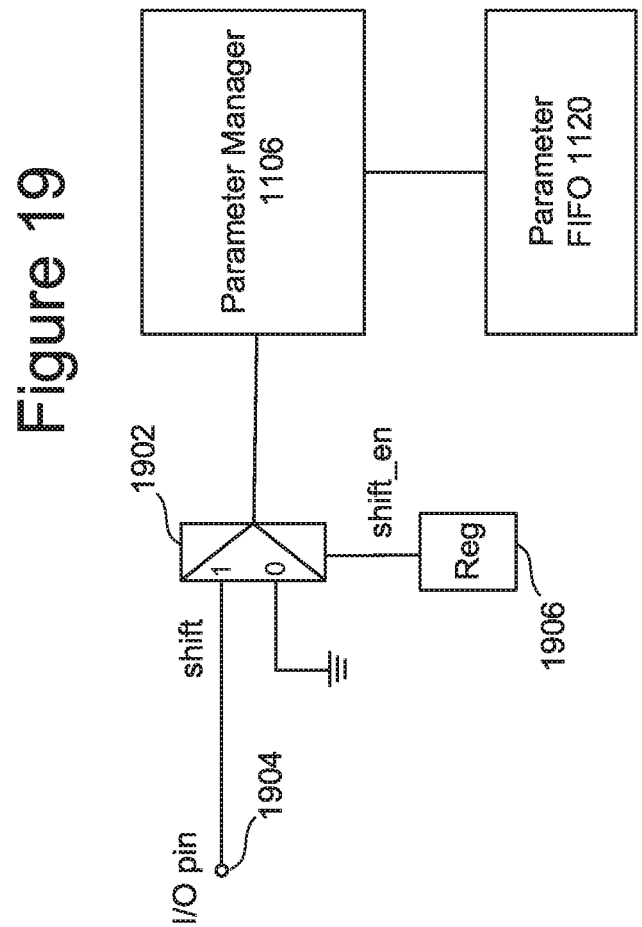
FIG. 19 is a block diagram of one embodiment of connecting a combinational logic circuit to a processor.

FIGS. 17 and 18 provide an example of using a combinational logic circuit with Sequencer 1104. Combinational logic circuits can also be used with Parameter Manager 1106, Core Manager 1108 and Sense Manager 1110. FIG. 19 provides an example of using a combinational logic circuit with Parameter Manager 1106. FIG. 19 provides another example of a processor that is programmable by software and connected to a combinational logic circuit where the control circuit is configured to receive a command to perform a memory operation on a non-volatile memory structure, the combinational logic circuit is configured to calculate a first condition for the non-volatile memory structure for the command, and the processor is configured to determine a control signal for performing the command on the non-volatile memory structure based on the first condition calculated by the combinational logic.

FIG. 19 shows Parameter Manager 1106 connected to Parameter FIFO 1120. Note that Parameter Manager 1106 is indirectly connected to Core Manager 1108 and Sense Manager 1110 via FIFO Manager 1124, as described above with respect to FIG. 11. FIG. 19 shows a multiplexer 1902, having an output connected to Parameter Manager 1106. A first input of multiplexer 1902, labeled "shift" is connected to an I/O pin 1904 for the memory die 108 (see FIG. 1). For example, I/O pin 1904 may be connected to controller 122. A second input of multiplexer 1902 is connected to ground. A selection signal for multiplexer 1902 is connected to register 1906. In one embodiment, register 1906 can be written to by controller 122.

In some embodiments of a memory system, the program voltage Vpgm applied to the selected word line (see FIG. 7, step 772 of FIG. 5, and step 738 of FIG. 6) can be expressed as:

$$Vpgm = Vpgm_{initial} + X*\Delta + \text{shift}$$

where: $Vpgm_{initial}$ is the magnitude of the first voltage pulse;
X is the number of program pulses applied after the first voltage pulse;
$\Delta$ is the step size (see step 786 of FIG. 5); and
"shift" is a voltage that is added to Vpgm to account for changes in temperature, cycling (program-erase cycles) and performance of the memory. The shift can be 0 or a positive amount of voltage.

The circuit of FIG. 19 provide a fast means for calculating the shift (e.g., parameter/condition) and providing the result to Parameter Manager 1106. For example, the shift can be calculated in advance by the controller and sent to I/O pin 1904. Then, multiplexer 1902 can toggle between 0 volts and the shift voltage from the controller, and provide the selected result to Parameter Manager 1106.

Other combinational logic circuits can be connected to Core Manager 1108 and/or Sense Manager 1110 to calculate voltage magnitudes and timing for the signals of FIG. 7, for use by or with Core Manager 1108 and/or Sense Manager 1110.

FIG. 20 is a flow chart describing one embodiment of a process for operating a microcontroller that includes one or more combinational logic circuits. In step 2002, MCU 112 receives a command to perform a memory operation on non-volatile memory structure 1216. For example, controller 122 instructs memory die 108 to program, erase or read data. In response to the command, in step 2004 MCU 112 uses a first processor programmed by software to generate a first portion of a message. For example, ALU+Control circuit 1702 generates a subset of the bits of command packet 1130. In response to the command, in step 2006 MCU 112 uses the combinational logic circuit that is separate from the first processor to generate a second portion of the message concurrently while the first processor generates the first portion of the message. For example, combinational logic 1712 generates a subset of the bits of command packet 1130. In step 2008, the message is completed by combining the first portion of the message with the second portion of the message (e.g., using packet builder circuit 1714). In step 2010, the completed message is sent to a second processor (e.g., Parameter Manager 1106, Core Manager 1108 and/or Sense Manager 1110). In step 2012, in response to receiving the completed message, the second processor generates control signals for the non-volatile memory structure. In step 2014, memory die 108 performs the memory operation on the non-volatile memory structure based on the control signals generated in step 2012.

FIG. 21 is a flow chart describing another embodiment of a process for operating a microcontroller that includes one or more combinational logic circuits. In step 2102, MCU 112 receives a command to perform a memory operation on non-volatile memory structure 1216. For example, controller 122 instructs memory die 108 to program, erase or read data. In this embodiment, MCU 112 includes a plurality of processors and a plurality of combinational logic circuits connected to the processors. In response to the command, in step 2104 one or more of the processors of MCU 112 calculates one or more conditions. Also in response to the command, in step 2106 one or more of the combinational logic circuit(s) determine one or more conditions. In step 2108, the combinational logic circuit(s) report the calculated conditions to the processor(s). In step 2110, in response to the calculated conditions, the processors generate control signals for the non-volatile memory structure. In step 2112, memory die 108 performs the memory operation on the non-volatile memory structure based on the control signals generated in step 2110.

Examples of the control signals generated by the processors of the MCU discussed above include (but are not limited to) the signals provided to decoders 124/132 and read/write circuits 128 (including sense blocks) of FIG. 1, the signals to control circuit 580 of FIG. 3, the signals depicted in FIG. 7 or provided to voltage generators to generate the signals depicted in FIG. 7, the signals used to perform all or a subset of the operations of FIGS. 6, 8 and 9, and the signals that control the components depicted in FIG. 1B, including signals that control the bit line latches, the sense circuitry, the data latch processor, the data latches (LDL, MDL, UDL) and I/O interface 198.

The above discussion describes a programmable MCU that provides flexibility to make changes in operation of the memory system. Additionally, the proposed MCU includes combinational logic circuits to speed up the calculation of some conditions/parameters in order to increase overall performance of the memory system.

One embodiment includes a non-volatile storage apparatus comprising a non-volatile memory structure and a control circuit connected to the non-volatile memory structure. The control circuit is configured to control the non-volatile memory structure to perform memory operations by generating and applying a set of control signals to operate the non-volatile memory structure. The control circuit comprises a first combinational logic circuit configured to receive an input and calculate a first version of a parameter based on the input, a first programmable processor configured to receive the input and configurable to calculate a second version of the parameter based on the input (the first version of the parameter is different than the second version of the parameter), a switching circuit connected to the first programmable processor and the first combinational logic circuit, and a second programmable processor connected to the switching circuit. The switching circuit is configured to receive the first version of the parameter from the first combinational logic circuit and the second version of the parameter from the first programmable processor and selectively create an output parameter based on either the first version of the parameter or the second version of the parameter. The second programmable processor is configured to receive the output parameter from the switching circuit and use the output parameter to determine a first control signal of the set of control signals.

One example implementation further includes a second combinational logic circuit connected to the second programmable processor. The second combinational logic circuit is configured to calculate a second condition. The second programmable processor is configured to determine a second control signal of the set of control signals based on the second condition calculated by the second combinational logic circuit.

One example implementation further includes a second combinational logic circuit connected to the second programmable processor. The second combinational logic circuit is configured to calculate a condition for the non-volatile memory structure. The second programmable processor is configured to determine the first control signal of the set of control signals based on the condition calculated by the second combinational logic circuit and the output of the switching circuit.

One example implementation further includes a clock signal connected to the first programmable processor. The first programmable processor is configured to calculate the second version of the parameter over multiple cycles of the clock signal. The first combinational logic circuit is configured to calculate the first version of the parameter during one clock cycle of the clock signal.

In one example implementation, the control circuit further comprises: voltage generators, the non-volatile memory structure includes word lines and bit lines, the voltage generators are connected to the word lines and the second programmable processor; sense amplifiers connected to the bit lines; latching circuits connected to the sense amplifiers; and a third programmable processor connected to the first programmable processor and the latching circuits, the third programmable processor configured to generate a second control signal of the set of control signals, the first control signal controls one or more of the voltage generators, the second control signal controls the latching circuits.

One example implementation further includes a second combinational logic circuit connected to the second programmable processor, the second combinational logic circuit configured to calculate a first condition for the non-volatile memory structure, the second programmable processor configured to determine a third control signal of the set of control signals based on the first condition calculated by the second combinational logic circuit; and a third combinational logic circuit connected to the third processor, the third combinational logic circuit configured to calculate a second condition for the non-volatile memory structure, the third processor configured to determine a fourth control signal of the set of control signals based on the second condition calculated by the third combinational logic circuit.

One embodiment includes a method comprising receiving a command to perform a memory operation on a non-volatile memory structure; in response to the command, using a first processor programmed by software to generate a first portion of a message; in response to the command, using a combinational logic circuit that is separate from the first processor to generate a second portion of the message concurrently while the first processor generates the first portion of the message; combining the first portion of the message with the second portion of the message to create a completed message; sending the completed message to a second processor; in response to the completed message, generating control signals for the non-volatile memory structure at the second processor; and performing the memory operation on the non-volatile memory structure based on the control signals.

One embodiment includes a non-volatile storage apparatus comprising a non-volatile memory structure and a control circuit connected to the non-volatile memory structure. The control circuit is configured to control the non-volatile memory structure to perform memory operations by generating and applying a set of control signals to the non-volatile memory structure. The control circuit comprises a first processor that is programmable by software and a first combinational logic circuit connected to the first processor. The control circuit is configured to receive a command to perform a memory operation on the non-volatile memory structure. The first combinational logic circuit is configured to calculate a first condition for the non-volatile memory structure for the command. The first processor is configured to determine a first control signal for performing the command on the non-volatile memory structure based on the first condition calculated by the first combinational logic.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
    a non-volatile memory structure; and
    a control circuit connected to the non-volatile memory structure, the control circuit is configured to control the non-volatile memory structure to perform memory operations by generating and applying a set of control signals to operate the non-volatile memory structure, the control circuit comprises:
        a first combinational logic circuit configured to receive an input and calculate a first version of a parameter based on the input,
        a first programmable processor configured to receive the input and configurable to calculate a second version of the parameter based on the input, the first version of the parameter is different than the second version of the parameter,
        a switching circuit connected to the first programmable processor and the first combinational logic circuit, the switching circuit is configured to receive the first version of the parameter from the first combinational logic circuit and the second version of the parameter from the first programmable processor and selectively create an output parameter based on either the first version of the parameter or the second version of the parameter, and
        a second programmable processor connected to the switching circuit, the second programmable processor is configured to receive the output parameter from the switching circuit and use the output parameter to determine a first control signal of the set of control signals.

2. The non-volatile storage apparatus of claim 1, further comprising:
    a second combinational logic circuit connected to the second programmable processor, the second combinational logic circuit is configured to calculate a second condition, the second programmable processor is configured to determine a second control signal of the set of control signals based on the second condition calculated by the second combinational logic circuit.

3. The non-volatile storage apparatus of claim 1, further comprising:
    a second combinational logic circuit connected to the second programmable processor, the second combinational logic circuit is configured to calculate a condition for the non-volatile memory structure, the second programmable processor is configured to determine the first control signal of the set of control signals based on the condition calculated by the second combinational logic circuit and the output of the switching circuit.

4. The non-volatile storage apparatus of claim 1, further comprising:
    a clock signal connected to the first programmable processor, the first programmable processor is configured to calculate the second version of the parameter over multiple cycles of the clock signal, the first combinational logic circuit is configured to calculate the first version of the parameter during one clock cycle of the clock signal.

5. The non-volatile storage apparatus of claim 1, wherein the control circuit further comprises:
    voltage generators, the non-volatile memory structure includes word lines and bit lines, the voltage generators are connected to the word lines and the second programmable processor;
    sense amplifiers connected to the bit lines;
    latching circuits connected to the sense amplifiers; and
    a third programmable processor connected to the first programmable processor and the latching circuits, the third programmable processor is configured to generate a second control signal of the set of control signals, the first control signal controls one or more of the voltage generators, the second control signal controls the latching circuits.

6. The non-volatile storage apparatus of claim 5, further comprising:
    a second combinational logic circuit connected to the second programmable processor, the second combinational logic circuit is configured to calculate a first condition for the non-volatile memory structure, the second programmable processor is configured to determine a third control signal of the set of control signals based on the first condition calculated by the second combinational logic circuit; and
a third combinational logic circuit connected to the third processor, the third combinational logic circuit is configured to calculate a second condition for the non-volatile memory structure, the third processor configured to determine a fourth control signal of the set of control signals based on the second condition calculated by the third combinational logic circuit.

7. The non-volatile storage apparatus of claim 5, wherein:
the non-volatile memory structure includes word lines and bit lines;
the control circuit includes sense amplifiers connected to the bit lines and latching circuits connected to the sense amplifiers;
the first programmable processor is configured as a master to the second programmable processor and the third processor;
the second programmable processor controls the word lines based on the output parameter from the switching circuit; and
the third processor controls the latching circuits.

8. The non-volatile storage apparatus of claim 7, wherein:
the third processor controls the latching circuits based on the output parameter from the switching circuit.

9. The non-volatile storage apparatus of claim 1, wherein:
the first combinational logic circuit is configured to generate a first portion of a message in response to the input and provide the first portion of the message to the switching circuit;
the first programmable processor is configured to generate a second portion of the message in response to the input and provide the second portion of the message to the switching circuit;
the switching circuit is configured to combine the first portion of the message with the second portion of the message to generate an output message; and
the second programmable processor configured to receive the output message and determine a second control signal of the set of control signals based on the output message.

10. The non-volatile storage apparatus of claim 9, wherein:
the output message includes a plurality of bits, one of the plurality of bits is the output parameter;
a subset of the first portion of the message has a common bit with a subset of the second portion of the message; and
the first programmable processor instructs the switching circuit to override the common bit of the first portion of the message with the common bit of the second portion of the message.

11. The non-volatile storage apparatus of claim 1, wherein:
the first prorgammable processor comprises an ALU circuit connected to a register file, an instruction memory and RAM;
the ALU circuit and the register file are connected to the first combinational logic circuit; and
the ALU circuit is connected to the switching circuit.

12. The non-volatile storage apparatus of claim 1, wherein:
the non-volatile memory structure, the first programmable processor, the second programmable processor and the switching circuit are on a common memory die.

13. The non-volatile storage apparatus of claim 1, wherein:
the first programmable processor is configurable to calculate the second version of the parameter based on the input by programming the first programmable processor with software.

14. A method, comprising:
receiving a command to perform a memory operation on a non-volatile memory structure;
in response to the command, using a first processor programmed by software to generate a first portion of a message;
in response to the command, using a combinational logic circuit that is separate from the first processor to generate a second portion of the message concurrently while the first processor is generating the first portion of the message;
combining the first portion of the message with the second portion of the message to create a completed message;
sending the completed message to a second processor;
in response to the completed message, generating control signals for the non-volatile memory structure at the second processor; and
performing the memory operation on the non-volatile memory structure based on the control signals.

15. The method of claim 14, wherein:
the message includes a plurality of bits;
the first portion of the message has a common bit with the second portion of the message; and
the first processor instructs a message building circuit connected to the first processor and the combinational logic circuit to override the common bit of the second portion of the message with the common bit of the first portion of the message.

16. The method of claim 14, wherein:
the message includes a plurality of bits; and
the first processor instructs a message building circuit connected to the first processor and the combinational logic circuit to use bits of the second portion of the message from the combinational logic circuit rather than bits from the first processor.

17. The method of claim 14, wherein:
the first processor, the second processor and the non-volatile memory structure are on a common memory die;
the first processor and the second processor comprise a control circuit for the non-volatile memory structure;
the first processor is connected to a controller for a memory system that includes the common memory die;
the controller is in communication with a host;
the memory operation includes one of writing data to non-volatile memory cells in the non-volatile memory structure and reading data from non-volatile memory cells in the non-volatile memory structure; and
the control signals control voltages applied to bit lines and word lines of the non-volatile memory structure.

18. The method of claim 14, wherein:
the first processor receives a clock signal;
the first processor generates the first portion of the message over multiple clock cycles of the clock signal; and
the combinational logic circuit generates the second portion of the message during one clock cycle of the clock signal.

19. An non-volatile storage apparatus, comprising:
a non-volatile memory structure; and
a control circuit connected to the non-volatile memory structure, the control circuit is configured to control the non-volatile memory structure to perform memory operations by generating and applying a set of control signals to the non-volatile memory structure, the control circuit comprises:

a first processor that is programmable by software, and
a first combinational logic circuit connected to the first processor, the control circuit is configured to receive a command to perform a memory operation on the non-volatile memory structure, the first combinational logic circuit is configured to calculate a first condition for the non-volatile memory structure for the command, the first processor is configured to determine a first control signal for performing the command on the non-volatile memory structure based on the first condition calculated by the first combinational logic.

20. The non-volatile storage apparatus of claim 19, wherein:

the control circuit comprises a plurality of connected processors that include the first processor, each of the connected processors are connected to a separate combinational logic circuit for generating condition data used by the plurality of connected processors to generate and apply the set of control signals to operate the non-volatile memory structure, the condition data includes the first condition.

* * * * *